(12) United States Patent
Otaki et al.

(10) Patent No.: US 10,288,489 B2
(45) Date of Patent: May 14, 2019

(54) METHOD AND DEVICE FOR MEASURING WAVEFRONT USING LIGHT-EXIT SECTION CAUSING LIGHT AMOUNT DISTRIBUTION IN AT LEAST ONE DIRECTION

(71) Applicant: NIKON CORPORATION, Tokyo (JP)

(72) Inventors: Katsura Otaki, Kamakura (JP); Katsumi Sugisaki, Tokyo (JP); Takashi Gemma, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 293 days.

(21) Appl. No.: 14/401,860

(22) PCT Filed: May 29, 2013

(86) PCT No.: PCT/JP2013/064949
§ 371 (c)(1),
(2) Date: Feb. 10, 2015

(87) PCT Pub. No.: WO2013/180187
PCT Pub. Date: Dec. 5, 2013

(65) Prior Publication Data
US 2015/0160073 A1    Jun. 11, 2015

(30) Foreign Application Priority Data
May 30, 2012   (JP) ................................. 2012-123813

(51) Int. Cl.
*G01J 9/02* (2006.01)
*G01M 11/02* (2006.01)
(Continued)

(52) U.S. Cl.
CPC ....... *G01J 9/0215* (2013.01); *G01M 11/0264* (2013.01); *G02B 27/50* (2013.01); *G03F 7/706* (2013.01); *G01J 2009/0238* (2013.01)

(58) Field of Classification Search
CPC ........................... G03F 7/70583; G03F 7/706; G01M 11/0264; G01B 9/02098; G01J 9/0215; G01J 2009/0238; G02B 27/50
See application file for complete search history.

(56) References Cited

U.S. PATENT DOCUMENTS 6,573,015 B2 *   6/2003   Fujimoto ................ G03F 7/706
                                                           430/30
6,573,997 B1 *   6/2003   Goldberg ........... G01M 11/0264
                                                           356/515
(Continued)

FOREIGN PATENT DOCUMENTS

DE      10258142 A1    6/2004
JP    2007-173461 A    7/2007
(Continued)

OTHER PUBLICATIONS

Hibino et al., "Quantitative Wavefront Measurement with a Phase Shifting Ronchi Interferometer," Journal of Mechanical Engineering Laboratory, vol. 53, No. 4, pp. 145-151, 1999.
(Continued)

*Primary Examiner* — Michael P Lapage
(74) *Attorney, Agent, or Firm* — Oliff PLC

(57) ABSTRACT

There is provided a wavefront measuring method for obtaining wavefront information of an optical system. The method including: irradiating the optical system with a light beam; allowing the light beam passed via the optical system to come into a diffraction grating having periodicity in a first direction; and obtaining the wavefront information based on an interference fringe formed by light beams generated from the diffraction grating. The diffraction grating including: first portions which allow light to pass therethrough; and second portions which shield light, each of the second portions being provided between two of the first portions. A ratio between a width of one of the first portions in the first (Continued)

direction and a width of one of the second portions in the first direction is changed in the first direction, the one of the first portions and the one of the second portions being adjacent to each other.

22 Claims, 14 Drawing Sheets

(51) Int. Cl.
*G03F 7/20* (2006.01)
*G02B 27/50* (2006.01)

(56) References Cited

U.S. PATENT DOCUMENTS

| | | | | |
|---|---|---|---|---|
| 7,190,443 B2* | 3/2007 | Shiode | ............... | G01M 11/0264 356/124 |
| 7,382,446 B2* | 6/2008 | Morohoshi | ............. | G03F 7/706 250/548 |
| 7,495,742 B2* | 2/2009 | Shiode | ................... | G03F 7/706 355/52 |
| 7,576,870 B2* | 8/2009 | Furukawa | ............... | G03F 7/706 356/515 |
| 2003/0025890 A1 | 2/2003 | Nishinaga | | |
| 2003/0133099 A1* | 7/2003 | Shiode | ............... | G01M 11/0264 356/124 |
| 2004/0156041 A1 | 8/2004 | Shiode | | |
| 2006/0244940 A1 | 11/2006 | Uehara | | |
| 2007/0046929 A1 | 3/2007 | Shiode | | |
| 2007/0285671 A1* | 12/2007 | Tezuka | ............... | G01M 11/0264 356/515 |
| 2008/0186509 A1* | 8/2008 | Kato | ...................... | B82Y 10/00 356/521 |
| 2010/0190115 A1* | 7/2010 | Kato | ........................ | G03F 7/706 430/325 |
| 2010/0302523 A1 | 12/2010 | Shiraishi | | |

FOREIGN PATENT DOCUMENTS

| | | | | |
|---|---|---|---|---|
| JP | 2010-206033 | * | 9/2010 | ............. H01L 21/30 |
| JP | 2011-108696 A | | 6/2011 | |
| TW | 201109851 A | | 3/2011 | |
| WO | WO/2004/051206 | * | 6/2004 | ................ G01J 9/02 |
| WO | 2010/134487 A1 | | 11/2010 | |

OTHER PUBLICATIONS

Hibino et al., "Dynamic Range of Ronchi Test with a Phase-Shifted Sinusoidal Grating," Applied Optics, vol. 36, No. 25, pp. 6178-6189, Sep. 1, 1997.
Lin et al., "Testing a Zone Plate with a Grating Interferometer," Applied Optics, vol. 29, No. 34, pp. 5151-5158, Dec. 1, 1990.
Sep. 3, 2013 International Search Report issued in International Application No. PCT/JP2013/064949.
Sep. 3, 2013 Written Opinion issued in International Application No. PCT/JP2013/064949.
Jan. 7, 2016 Extended Search Report issued in European Patent Application No. 13797892.0.
Hibino et al., "Quantitative Wavefront Measurement with Phase Shifting Ronchi Interferometer," Journal of Mechanical Engineering Laboratory, vol. 53, No. 4, pp. 145-151, 1999.
Relevant portions of Applied Optics, pp. 178-181.
May 4, 2017 Office Action issued in Chinese Application No. 201380027918.9.
Oct. 21, 2016 Office Action issued in Chinese Application No. 201380027918.9.
Apr. 3, 2018 Office Action issued in Chinese Application No. 201380027918.9.
Sep. 5, 2018 Office Action issued in Japanese Application No. 2017-153141.
Feb. 3, 2019 Office Action issued in Chinese Application No. 201380027918.9.

* cited by examiner

7-DIVISION  Li [nm]  Si [nm]

| AREA | LIGHT-SHIELDING PORTION | LIGHT-TRANSMITTING PORTION |
|---|---|---|
| 1 | 1043 | 100 |
| 2 | 807 | 336 |
| 3 | 336 | 807 |
| 4 | 100 | 1043 |
| 5 | 336 | 807 |
| 6 | 807 | 336 |
| 7 | 1043 | 100 |

9-DIVISION  Li [nm]  Si [nm]

| AREA | LIGHT-SHIELDING PORTION | LIGHT-TRANSMITTING PORTION |
|---|---|---|
| 1 | 789 | 100 |
| 2 | 688 | 201 |
| 3 | 444 | 444 |
| 4 | 201 | 688 |
| 5 | 100 | 789 |
| 6 | 201 | 688 |
| 7 | 444 | 444 |
| 8 | 688 | 201 |
| 9 | 789 | 100 |

11-DIVISION  Li [nm]  Si [nm]

| AREA | LIGHT-SHIELDING PORTION | LIGHT-TRANSMITTING PORTION |
|---|---|---|
| 1 | 627 | 100 |
| 2 | 577 | 150 |
| 3 | 445 | 282 |
| 4 | 282 | 445 |
| 5 | 150 | 577 |
| 6 | 100 | 627 |
| 7 | 150 | 577 |
| 8 | 282 | 445 |
| 9 | 445 | 282 |
| 10 | 577 | 150 |
| 11 | 627 | 100 |

Fig. 4(continued page)
(B)
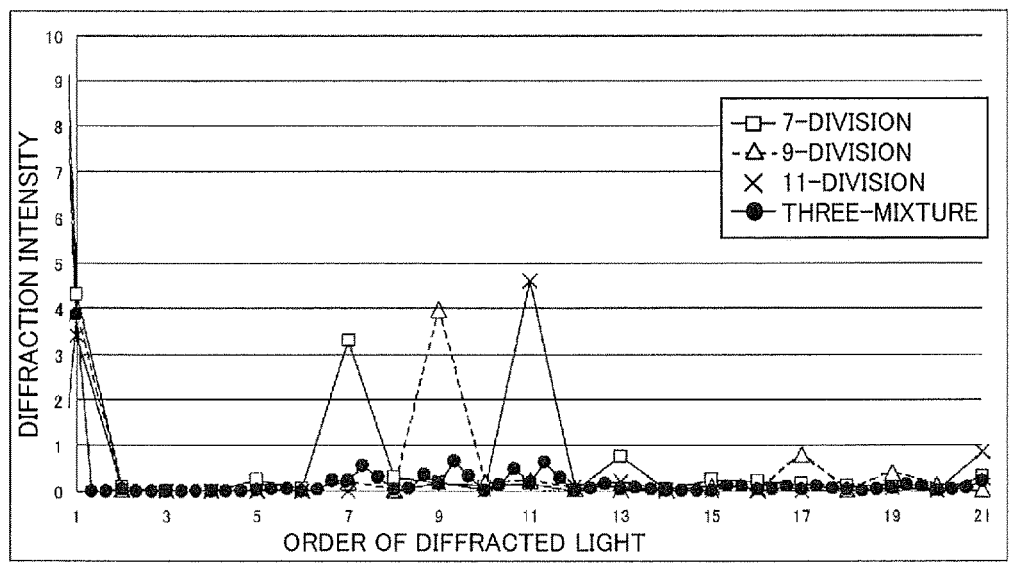
(C)
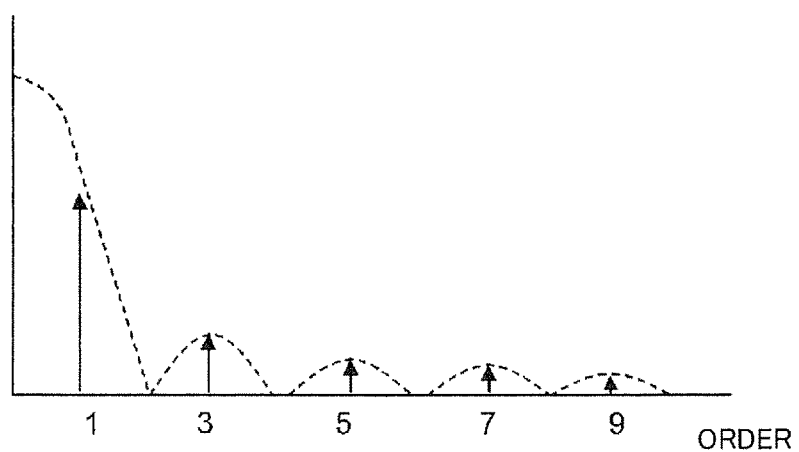

Fig. 6(continued page)
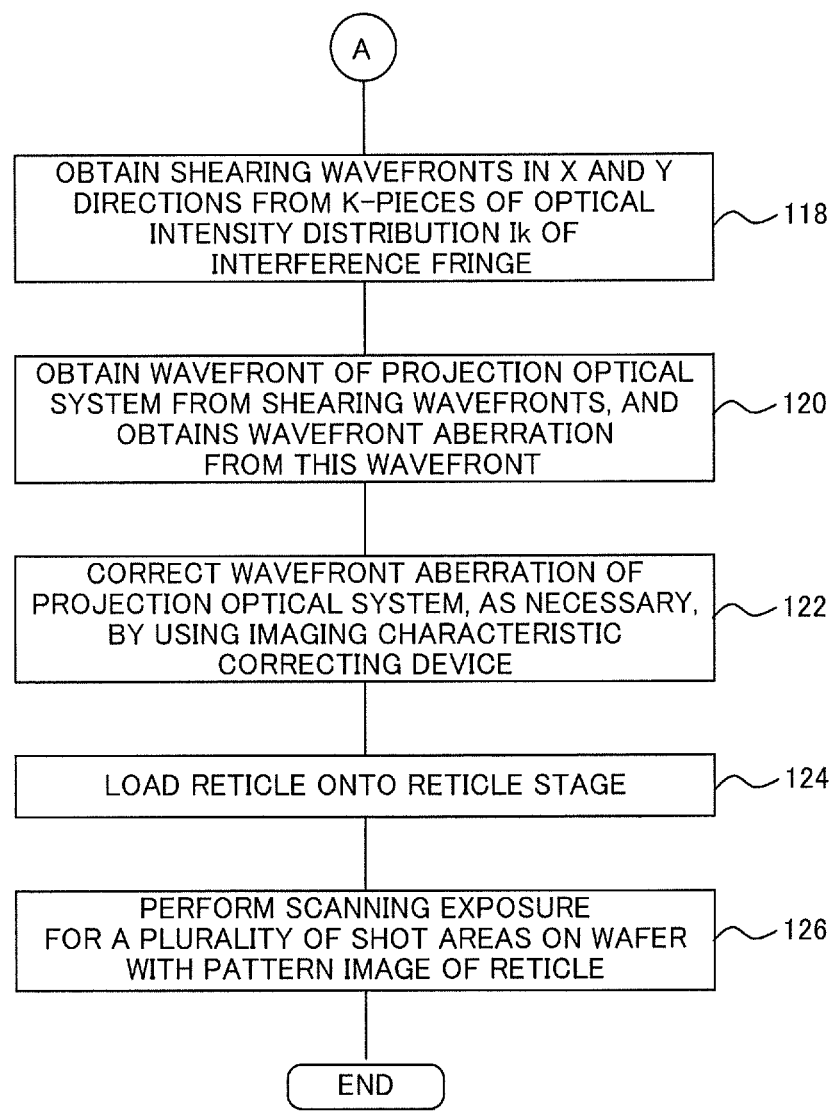

(A)

9-DIVISION

| AREA | Li[nm] L | Si[nm] S |
|---|---|---|
| 1 | 3156 | 400 |
| 2 | 2752 | 804 |
| 3 | 1778 | 1778 |
| 4 | 804 | 2752 |
| 5 | 400 | 3156 |
| 6 | 804 | 2752 |
| 7 | 1778 | 1778 |
| 8 | 2752 | 804 |
| 9 | 3156 | 400 |

9-DIVISION

| AREA | Li[nm] L | Si[nm] S |
|---|---|---|
| 1 | 3456 | 100 |
| 2 | 2964 | 591 |
| 3 | 1778 | 1778 |
| 4 | 591 | 2964 |
| 5 | 100 | 3456 |
| 6 | 591 | 2964 |
| 7 | 1778 | 1778 |
| 8 | 2964 | 591 |
| 9 | 3456 | 100 |

(B)

METHOD AND DEVICE FOR MEASURING WAVEFRONT USING LIGHT-EXIT SECTION CAUSING LIGHT AMOUNT DISTRIBUTION IN AT LEAST ONE DIRECTION

CROSS-REFERENCE

This application is a U.S. national phase entry of International Application No. PCT/JP2013/064949 which was filed on May 29, 2013 claiming the conventional priority of Japanese Patent Application No. 2012-123813, filed on May 30, 2012 and the disclosure of Japanese Patent Application No. 2012-123813 is incorporated herein by reference in their entirety.

TECHNICAL FIELD

The present teaching relates to a wavefront measuring technique for measuring wavefront information of an optical system to be inspected based on an interference fringe generated by, for example, shearing interference; an exposure technique using the wavefront measuring technique; and a method for producing device using the exposure technique.

BACKGROUND ART

In an exposure apparatus used in the lithography process for producing semiconductor devices, etc., the wavelength of exposure light (exposure light beam) is progressively shortened so as to enhance the resolution. In the recent years, an exposure apparatus which uses, as the exposure light, a laser beam of which wavelength is in the range of the deep ultraviolet region to the vacuum ultraviolet region, such as ArF or KrF excimer laser. Further, there is also developed an exposure apparatus (EUV exposure apparatus) using, as the exposure light, an Extreme Ultraviolet Light (hereinafter referred to as "EUV light") including soft X-ray of which wavelength is about not more than 100 nm. In these exposure apparatuses, the wavefront aberration of projection optical system needs to be measured with high accuracy.

As a conventional measuring device for measuring the wavefront aberration, there is known a measuring device based on the shearing interference system in which a plurality of pinholes, etc. are arranged in rows in a predetermined manner on an object plane of a projection optical system; light beams generated from the pinholes are allowed to pass (be transmitted) via the projection optical system and a diffraction grating having a pattern composed of a large number of rectangular-shaped openings periodically arranged in two mutually orthogonal directions; and an interference fringe, produced by interference between laterally-shifted or deviated wavefronts of a plurality of diffracted lights generated (exiting, outgoing) from the diffraction grating, is optically received by an imaging element (see, for example, Japanese Patent Application Laid-open No. 2007-173461).

SUMMARY

In the conventional measuring device based on the shearing interference system, any higher order diffracted lights might exit with a relatively high light intensity from the opening patterns of the diffraction grating, and the higher order diffracted lights exited from the pinholes on the object plane of the projection optical system also pass via the projection optical system. Thus, there is such a fear that, for example, any noise of the higher order interference lights might mix with the interference fringe optically received, thereby lowering the accuracy or precision of the wavefronts to be restored.

In view of such a situation, an object of an aspect of the present teaching is to measure the wavefront information of the optical system to be inspected, with high accuracy, based on the interference fringe obtained by using the diffraction grating.

According to a first aspect of the present teaching, there is provided a wavefront measuring method for obtaining wavefront information of an optical system to be measured, the method including: irradiating the optical system with a light beam allowed to exit from a light-exit section; allowing the light beam passed via the optical system to come into a diffraction grating which has periodicity at least in a first direction; and obtaining the wavefront information of the optical system based on an interference fringe formed by a plurality of light beams generated from the diffraction grating, wherein the diffraction grating including: a plurality of first portions which allows a light to pass therethrough; and a plurality of second portions which shields the light, each of the plurality of second portions being provided between two of the plurality of first portions in the first direction, wherein a ratio between a width of one of the first portions in the first direction and a width of one of the second portions in the first direction is changed in the first direction, the one of the first portions and the one of the second portions being adjacent to each other.

According to a second aspect of the present teaching, there is provided an exposure method for illuminating a pattern with an exposure light and exposing a substrate with the exposure light via the pattern and a projection optical system, the exposure method including using the wavefront measuring method of the first aspect so as to measure wavefront aberration of the projection optical system.

According to a third aspect of the present teaching, there is provided a wavefront measuring method for obtaining wavefront information of an optical system to be measured, the method including: irradiating the optical system with a light beam which has a light amount distribution having periodicity at least in a first direction, allowing the light beam passed via the optical system to come into a diffraction grating which has periodicity at least in a direction corresponding to the first direction; and obtaining the wavefront information of the optical system based on an interference fringe formed by a plurality of light beams generated from the diffraction grating, wherein irradiating the optical system includes irradiating the optical system with the light beam via a light-exit section, the light-exit section including: a plurality of first portions which allows a light to pass therethrough; and a plurality of second portions which shields the light, each of the plurality of second portions being provided between two of the plurality of first portions in the first direction, wherein a ratio between a width of one of the first portions in the first direction and a width of one of the second portions in the first direction is changed in the first direction, the one of the first portions and the one of the second portions being adjacent to each other.

According to a fourth aspect of the present teaching, there is provided an exposure method for illuminating a pattern with an exposure light and exposing a substrate with the exposure light via the pattern and a projection optical system, the exposure method including using the wavefront measuring method of the third aspect so as to measure wavefront aberration of the projection optical system.

According to a fifth aspect of the present teaching, there is provided a wavefront measuring device configured to obtain wavefront information of an optical system to be measured, based on a light beam allowed to exit from a light-exit section, the device inclusing: a diffraction grating into which the light beam allowed to exit from the light-exit section and passed via the optical system comes, which has transmittance distribution having periodicity at least in a first direction; a detector configured to detect intensity distribution of an interference fringe formed by a plurality of light beams generated from the diffraction grating; and an arithmetic unit configured to obtain the wavefront information of the optical system based on a result of detection by the detector, wherein the diffraction grating including: a plurality of first portions which allows a light to pass therethrough; and a plurality of second portions which shields the light, each of the plurality of second portions being provided between two of the plurality of first portions in the first direction, wherein a ratio between a width of one of the first portions in the first direction and a width of one of the second portions in the first direction is changed in the first direction, the one of the first portions and the one of the second portions being adjacent to each other.

According to a sixth aspect of the present teaching, there is provided a wavefront measuring device configured to obtain wavefront information of an optical system to be measured, the device including: a light-exit section configured to allow a light beam to exit therefrom, the light beam having a light amount distribution, in a first direction, corresponding at least to one period of periodicity; a diffraction grating into which the light beam allowed to exit from the light-exit section and passed via the optical system comes, and which has periodicity at least in a direction corresponding to the first direction; a detector configured to detect intensity distribution of an interference fringe formed by a plurality of light beams generated from the diffraction grating; and an arithmetic unit configured to obtain the wavefront information of the optical system, based on a result of detection by the detector, wherein the light-exit section including: a plurality of first portions which allows a light to pass therethrough; and a plurality of second portions which shields the light, each of the plurality of second portions being provided between two of the plurality of first portions in the first direction, wherein a ratio between a width of one of the first portions in the first direction and a width of one of the second portions in the first direction is changed in the first direction, the one of the first portions and the one of the second portions being adjacent to each other.

BRIEF DESCRIPTION OF THE DRAWINGS

FIG. 4(A) is a view indicating an example of the combination of line widths of light-shielding portions and light-transmitting portions of three kinds of grating pattern units, FIG. 4(B) is a view indicating the intensities of diffracted lights exiting from the diffraction grating 10, and FIG. 4(C) is a view indicating the degree of coherence among diffracted lights in a case of using a surface light source which has periodicity.

DESCRIPTION OF THE EMBODIMENTS

First Embodiment

A first embodiment of the present teaching will be explained with reference to FIGS. 1 to 6.

Figure 1:
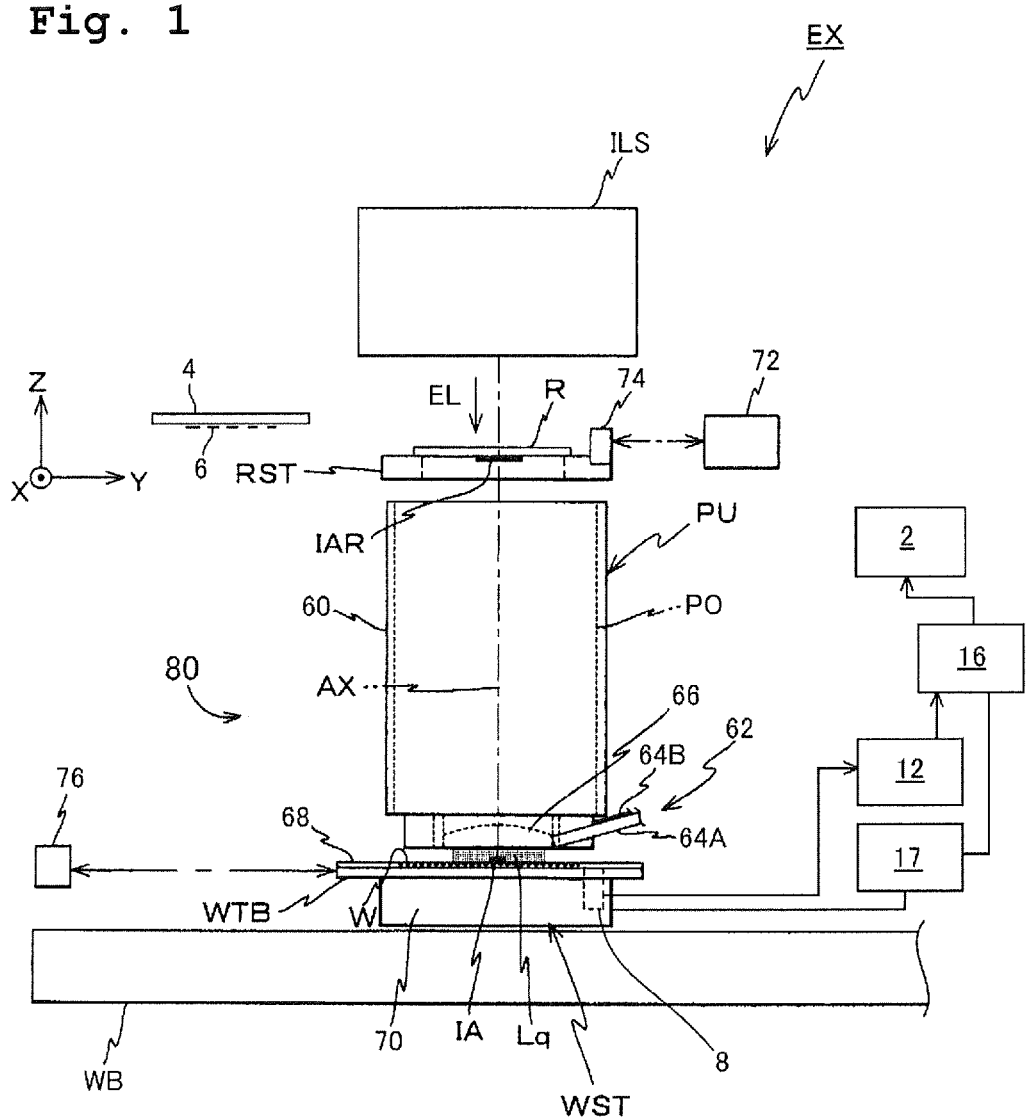
FIG. 1 is a view depicting an exposure apparatus provided with a wavefront aberration measuring device according to a first embodiment.
Figure 2:
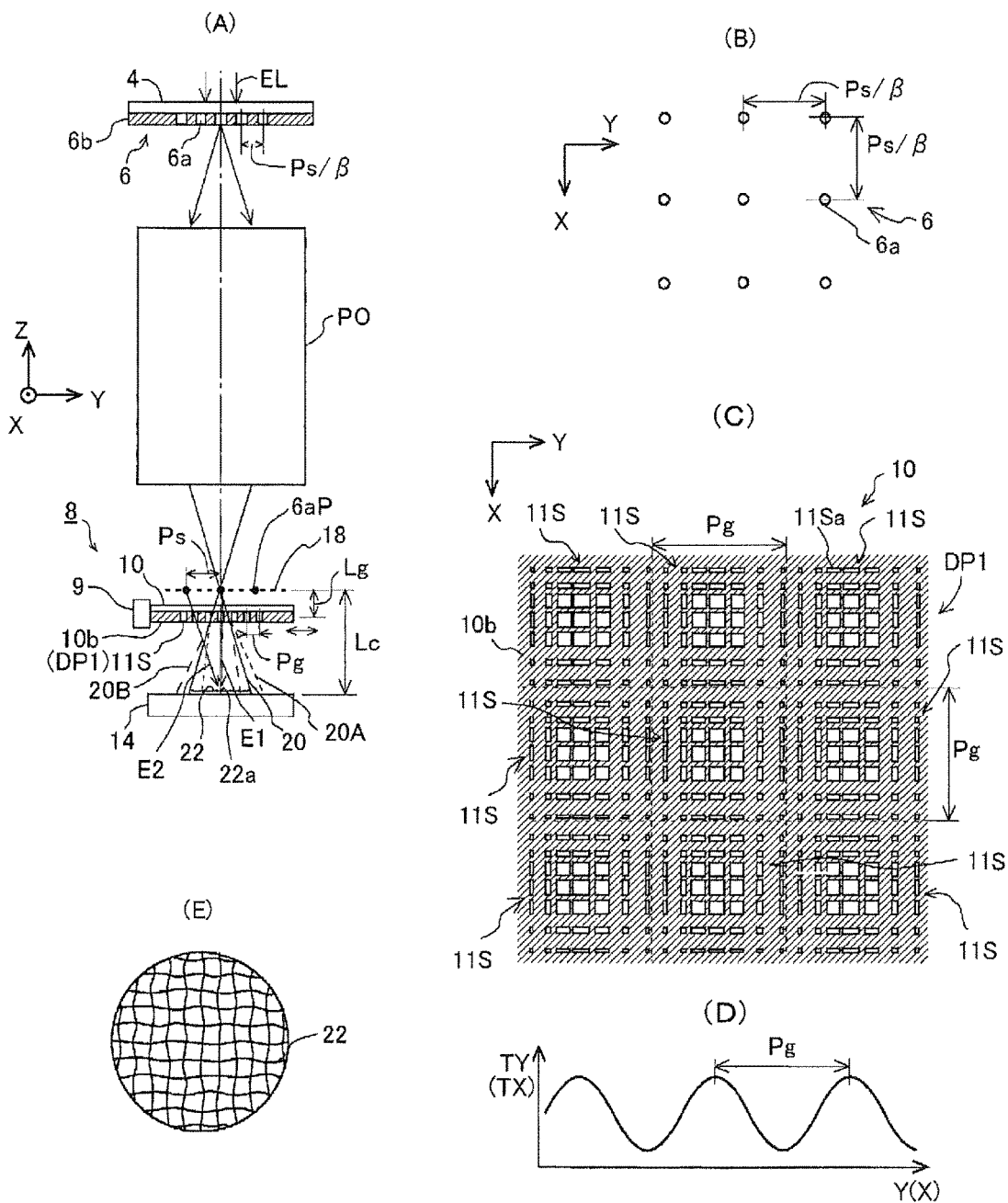
FIG. 2(A) is a view depicting a projection optical system PO and a body 8 of the wavefront aberration measurement device (measurement device body 8) in FIG. 1.
FIG. 2(B) is an enlarged view depicting a portion of a pinhole array in FIG. 2(A)
FIG. 2(C) is an enlarged view depicting a portion of a pattern of a diffraction grating 10 in FIG. 2(A)
FIG. 2(D) is a view depicting an example of transmittance distribution of the diffraction grating 10.
FIG. 2(E) is a view depicting example of an interference fringe in FIG. 2(A).
Figure 3:
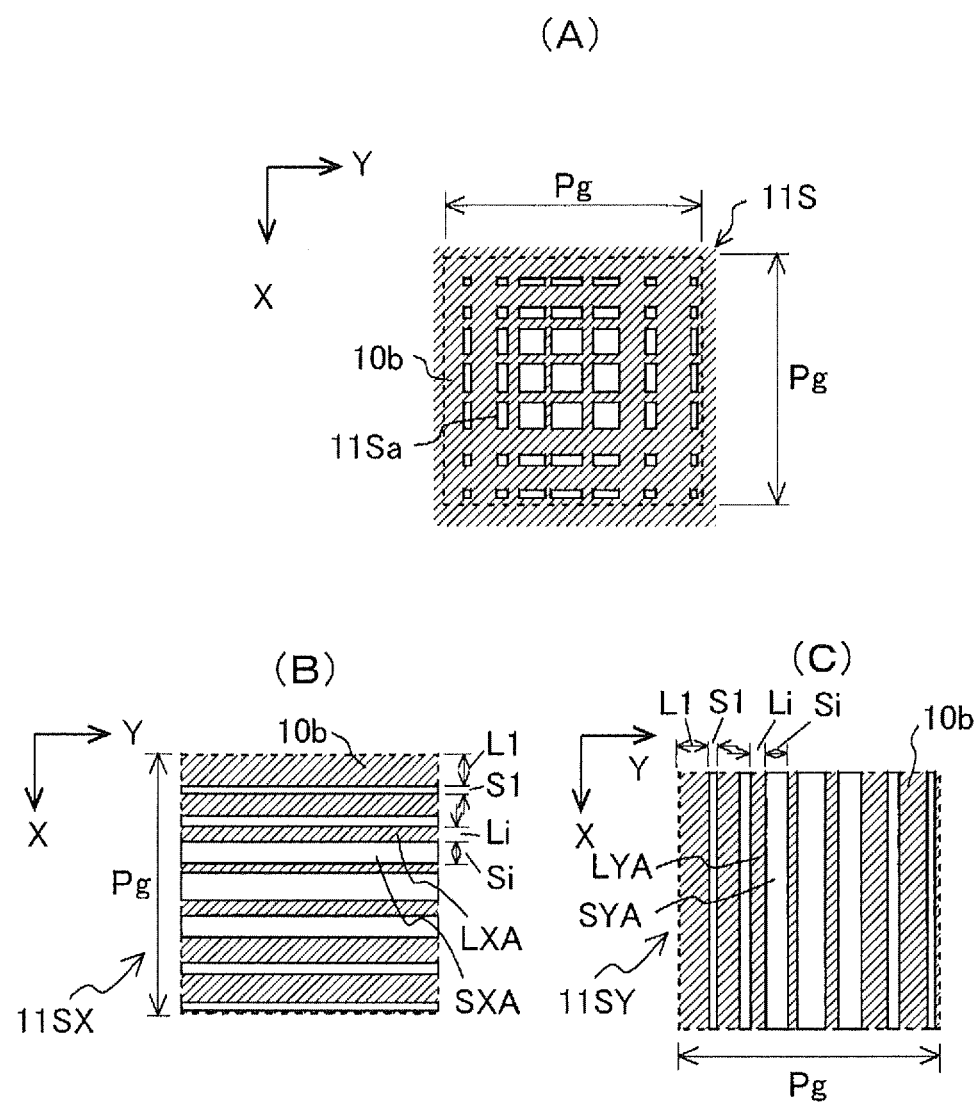
FIG. 3(A) is an enlarged view depicting a grating pattern unit in the diffraction grating 10.
FIG. 3(B) is an enlarged view depicting a grating pattern unit that is one-dimensional in X direction.
FIG. 3(C) is an enlarged view depicting a grating pattern unit that is one-dimensional in Y direction.
Figure 5:
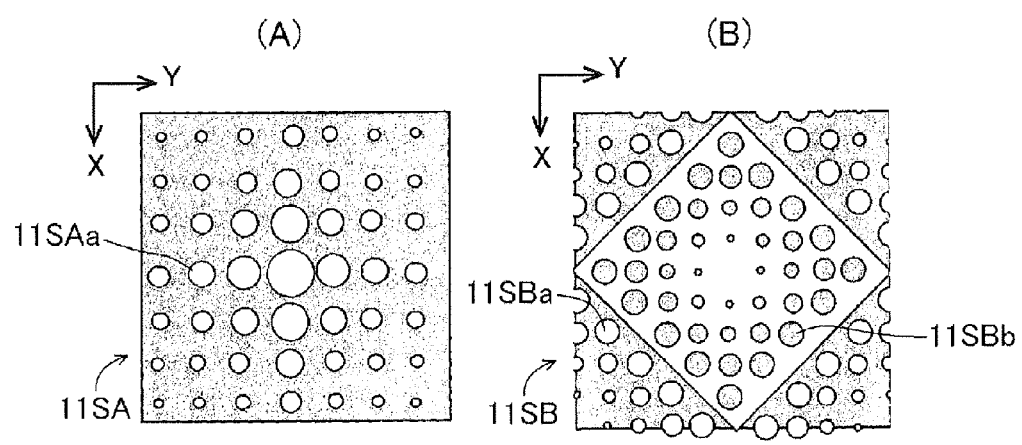
FIG. 5(A) is an enlarge view depicting a grating pattern unit of a modification.
FIG. 5(B) is an enlarged view depicting a grating pattern unit of another modification.

FIG. 1 schematically depicts the overall configuration of an exposure apparatus EX according to the first embodiment. The exposure apparatus EX is, as an example, a projection exposure apparatus of the scanning exposure type constructed of a scanning stepper (scanner). With reference to FIG. 1, the exposure apparatus EX is provided with a projection optical system PO (projection unit PU). In the following, an explanation will be given with the Z-axis being taken in parallel to an optical axis AX of the projection optical system PO, the Y axis being taken along a direction (scanning direction) in which a reticle and a wafer are scanned relative to each other in a plane perpendicular to the Z axis (plane substantially parallel to a horizontal plane), the X-axis being taken along a direction (non-scanning direction) orthogonal to the Z-axis and the Y-axis, and directions of rotation (inclination) about the X axis, the Y axis, and the Z axis being designated as θx, θy, and θz directions respectively.

The exposure apparatus EX is provided with an illumination system ILS; a reticle stage RST which holds a reticle R (mask) illuminated with illumination light or illumination light beam for the exposure (exposure light) EL from the illumination system ILS; a projection unit PU including the projection optical system PO which projects the illumination light EL allowed to exit (exiting) from the reticle R onto a wafer W (substrate); a wafer stage WST which holds the wafer W; a main control system 16 constructed of a computer controlling the entire operations of the exposure apparatus; and a wavefront measuring device 80 which measures information on wavefront aberration (wavefront aberration information) of the projection optical system PO.

The illumination system ILS includes, as disclosed for example in the specification of United States Patent Application Publication No. US 2003/0025890, a light source and an illumination optical system. The illumination optical system includes: a light amount distribution forming optical system which includes a diffractive optical element or a spatial light modulator, etc., and which forms light amount distribution for normal illumination, multi-pole illumination or annular (zonal) illumination, etc.; an illuminance uniformizing optical system including an optical integrator; a field stop (fixed reticle blind and movable reticle blind); and a condenser optical system (all of the above are not depicted in the drawings), etc. The illumination system ILS illuminates a slit-shaped illumination area IAR which is disposed on a pattern surface (lower surface) of the reticle R, which is defined by the field stop and which is elongated in the X direction, with the illumination light EL at a substantially uniform illuminance.

The ArF excimer laser beam (wavelength: 193 nm) is used as an example of the illumination light EL. It is also possible to use, as the illumination light EL, the KrF excimer laser beam (wavelength: 248 nm), the high harmonic wave such as the YAG laser or the solid-state laser (for example, the semiconductor laser), or the emission line (for example, i-line) of the mercury lamp.

The reticle R is held on the upper surface of the reticle stage RST by vacuum attraction, etc. A circuit pattern and an alignment mark are formed in the pattern surface of the reticle R. The reticle stage RST is capable of being minutely or finely driven in an XY plane and of being driven at a designated scanning velocity in the scanning direction (Y direction) by a stage driving system (not depicted) which includes, for example, a linear motor, etc.

The position information (including the positions in the X and Y directions and the rotational angle in the θz direction) of the reticle stage RST in the moving plane thereof is always detected at a resolution of, for example, about 0.5 nm to about 0.1 nm via a movement mirror 74 (or a mirror-finished end surface of the stage) by a reticle interferometer 72 constructed of a laser interferometer. A measured value by the reticle interferometer 72 is sent to the main control system 16. The main control system 16 controls the stage driving system based on the measured value of the reticle interferometer 72 to thereby control the position and velocity of the reticle stage RST.

In FIG. 1, the projection unit PU arranged at a position below or under the reticle stage RST is provided with a barrel 60, and the projection optical system PO including a plurality of optical elements which are held in a predetermined positional relationship inside the barrel 60. The projection optical system PO is, for example, telecentric on the both sides and has a predetermined projection magnification β (for example, reduction magnification such as ¼, ⅕, etc.). When the illumination area IAR of the reticle R is illuminated with the illumination light EL from the illumination system ILS, an image of the pattern in the illumination area IAR of the reticle R is formed via the projection unit PU (projection optical system PO) in an exposure area IA (area conjugated with the illumination area IAR) in one shot area of the wafer W by the illumination light EL allowed to pass through the reticle R. The wafer W includes, for example, a substrate constructed of a disk-shaped base member having a diameter in a range of about 200 mm to about 450 mm and composed of, for example, silicon, wherein a surface of the base member is coated with a photoresist (photosensitive material) to provide a predetermined thickness (for example, about several tens of nm to about 200 nm).

Also in this embodiment, there is provided an imaging characteristic correcting device 2 which controls the positions in the optical axis direction and angles of inclination of a predetermined plurality of optical elements in the projection optical system PO, the angles of inclination being angles about two axes orthogonal to each other in a plane perpendicular to the optical axis of the predetermined plurality of optical elements, for the purpose of correcting the imaging characteristic of the projection optical system PO, as disclosed, for example, in the specification of United States Patent Application Publication No. 2006/244940. By driving the imaging characteristic correcting device 2 based on a correction amount of the imaging characteristic, the imaging characteristic of the projection optical system PO is maintained in a desired state.

Further, the exposure apparatus EX is provided with a nozzle unit 62 which constructs a part or portion of a local liquid immersion device so as to surround an lower end portion of the barrel 60 holding an end-portion lens 66 which is included in the plurality of optical elements constructing the projection optical system PO and which is an optical element closest to the image plane side (closest to the wafer W side), for the purpose of performing the exposure to which the liquid immersion method is applied. The nozzle unit 62 has a supply port which is capable of supplying an exposure liquid Lq (for example, pure water or purified water) and a recovery port which has a porous member (mesh member) arranged therein and which is capable of recovering the liquid Lq. The supply port of the nozzle unit 62 is connected to a liquid supply device (not depicted) capable of feeding out the liquid Lq via a supply flow passage and a supply tube 64A.

During exposure of the wafer W based on the liquid immersion method, the liquid Lq fed out from the liquid supply device flows through the supply tube 64A and the supply flow passage of the nozzle unit 62 depicted in FIG. 1, and then the liquid Lq is supplied via the supply port to an liquid immersion area on the wafer W, including the optical path space of the illumination light EL. On the other hand, the liquid Lq recovered from the liquid immersion area via the recovery port of the nozzle unit 62 is recovered by a liquid recovery device (not depicted) via a recovery flow passage and a recovery tube 64B. Note that when the exposure apparatus EX is an exposure apparatus which is not of the liquid immersion type, the above-described local liquid immersion device may be omitted.

The wafer stage WST is supported in a non-contact manner via a plurality of non-depicted air pads on an upper surface, of a base plate WB, which is parallel to the XY plane. The wafer stage WST can be driven in the X and Y directions by, for example, a stage driving system 17 including a planer motor or two pairs of linear motors orthogonal to each other. Further, the exposure apparatus EX is provided with a position measuring system including a wafer interferometer 76 constructed of a laser interferometer and/ or an encoder system (not depicted) for the purpose of measuring positional information of the wafer stage WST.

The positional information (including the positions in the X and Y directions and the rotational angle in the θz direction) of the wafer stage WST in the moving plane thereof is always detected at a resolution of, for example, about 0.5 nm to about 0.1 nm by the position measuring system, and a measured value by the position measuring system is sent to the main control system 16. The main control system 16 controls the stage driving system 17 based on the measured value to thereby control the position and velocity of the wafer stage WST.

The wafer stage WST is provided with a body 70 of the wafer stage (stage body 70) which is driven in the X and Y directions; a wafer table WTB arranged on the stage body 70; and a Z-leveling mechanism (not depicted in the drawing) which is provided inside the stage body 70 and which finely or minutely drives the position in the Z direction, the tilt angles in the θx and θy directions of the wafer table WTB (wafer W) relative to the stage body 70. A wafer holder (not depicted), which holds the wafer W for example by the vacuum attraction, etc. on a suction surface approximately parallel to the XY plane, is provided on the wafer table WTB at an upper and central portion of the wafer table WTB.

Further, a flat plate-shaped plate body 68, having a high smoothness (flatness) and having a surface (or a protective member) which is subjected to the liquid-repellent treatment for the liquid Lq, is provided on the upper surface of the wafer table WTB. The surface of the plate body 68 is provided to be approximately flush with the surface of the wafer (wafer surface) placed on the wafer holder. The outer shape (contour) of the plate body 68 is rectangular, and a circular-shaped opening is formed in the central portion of the plate body 68, the opening being greater to some extent than the wafer holder (a wafer-placement area).

Further, a body 8 of the wavefront measurement device (measurement device body 8, to be described in detail later on) which is configured to measure the wavefront aberration of the projection optical system PO is installed in the wafer stage WST at an upper portion thereof so that the upper surface of the measurement device body 8 is at approximately the same height with the surface of the plate body 68. During measurement of the wavefront aberration of the projection optical system PO, as an example, a reticle for measurement (measurement reticle) 4 is loaded on the reticle stage RST, instead of the reticle R. The wavefront measuring device 80 has the illumination system ILS, the measurement reticle 4, the measuring device body 8, an arithmetic unit 12 which processes an imaging signal outputted from an imaging element 14 of the measuring device body 8 (see FIG. 2(A)) so as to obtain information of wavefront aberration (wavefront aberration information) of the projection optical system PO, and the main control system 16 which controls the operations of the measuring device body 8. The arithmetic unit 12 supplies the obtained wavefront aberration information to the main control system 16. The main control system 16 corrects the imaging characteristic of the projection optical system PO via the imaging characteristic correcting device 2 so as to correct the measured wavefront aberration, as necessary.

The exposure apparatus EX further has an alignment system (not depicted) configured to perform alignment for the reticle R and the wafer W, and an autofocus sensor (not depicted) configured to measure the distribution of the Z position (focus position) on the surface of the wafer W. By driving the Z-levelling mechanism of the wafer stage WST based on a measured value by the autofocus sensor, the surface of the wafer W is matched (focused on) the image plane of the projection optical system PO during the exposure.

When performing exposure of the wafer W, as a basic operation, the wafer W is subjected to the alignment, and then a shot area of the wafer W which is to be exposed is moved in front of the exposure area of the projection optical system PO by the movement of the wafer stage WST in the X direction and the Y direction (step movement). After that, under the control by the main control system 16, the entire shot area is subjected to the scanning exposure with the image of the transfer pattern of the reticle R by synchronously driving the reticle stage RST and the wafer state WST so that the reticle R and the wafer W are scanned relative to the projection optical system PO in the Y direction at, for example, a velocity ratio of the projection magnification β, while exposing the shot area on the wafer W with an image of a portion or part of the pattern (pattern image) of the reticle R as formed by the projection optical system PO. After that, the step-moving operation and the scanning exposure operation are repeated in the above-described manner. By doing so, respective shot areas of the wafer W are successively exposed with the pattern image of the reticle R in the step-and-scan manner.

In such an exposure, it is necessary that the wavefront aberration of the projection optical system PO falls within a predetermined allowable range. For realizing this, at first, it is necessary to measure the wavefront aberration of the projection optical system PO with high accuracy by using the wavefront measuring device 80.

In the following, the configuration of the wavefront measuring device 80 provided on the exposure apparatus EX of the present embodiment and the method for measuring the wavefront aberration of the projection optical system PO will be described. When measuring the wavefront aberration of the projection optical system PO, the measurement reticle 4 is loaded on the reticle stage RST. As an example, a pinhole array 6 of a plurality of pinholes regularly arranged in rows is formed on a pattern surface of the measurement reticle 4. Then, an upper portion of the measuring device body 8 is moved to the exposure area of the projection optical system PO, and the illumination light EL exited from the illumination system ILS comes into the measuring device body 8 via the pinhole array 6 and the projection optical system PO. In a case that the exposure apparatus EX is of the liquid immersion type, the liquid Lq may be supplied between the projection optical system PO and the measuring device body 8 also during the measuring of the wavefront aberration of the projection optical system PO. Note that it is also allowable to measure the wavefront aberration of the projection optical system PO without supplying the liquid Lq.

FIG. 2(A) depicts an example of arrangement of the measurement reticle 4, the projection optical system PO and the measurement device body 8 when measuring the wavefront aberration of the projection optical system PO. In FIG. 2(A), the measuring device body 8 is provided with: a diffraction grating 10 which is placed substantially in parallel with the XY plane and which has a two-dimensional grating pattern DF1 (to be described in detail later on) formed thereon; a two-dimensional imaging element 14 of the CCD type or CMOS type, etc. which detects an interference fringe of shearing interference formed by a plurality of diffracted lights generated from the diffraction grating 10; a holding member (not depicted) which holds the diffraction grating 10 and the imaging element 14; and a biaxial driving element 9, such as a piezoelectric element, which drives the diffraction grating 10 in the X direction and the Y direction relative to the holding member by a minute amount (distance corresponding about to one period to two periods of the diffraction grating 10). The driving amount of the driving element 9 is controlled by the main control system 16 of FIG. 1, and a detection signal from the imaging element 14 is supplied to the arithmetic unit 12.

The driving element 9 is used in a case of obtaining the shearing wavefront by the phase shift method, as will be described later. Note that, however, the driving element 9 may be omitted and that the diffraction grating 10 may be moved relative to the measurement reticle 4 by the wafer stage WST. Further, in a case of obtaining the shearing wavefront by the Fourier Transformation method, rather than by the phase shift method, the driving element 9 may be omitted and there is no need to move the diffraction grating 10 relative to the measurement reticle 4 during the measurement.

The optical system shown in FIG. 2(A) is a Talbot interferometer which generates the shearing interference. In FIG. 2(A), the pinhole array 6 of the measurement reticle 4 is placed on the object plane of the projection optical system PO, and the pinhole array 6 is illuminated by the illumination light EL. The pinhole array 6 is formed of a plurality of pinholes 6a which are periodically formed in a light-shielding film 6b made of a metal film provided on a pattern surface (lower surface) of a flat plate-shaped glass substrate of the measurement reticle 4.

As depicted in FIG. 2(B), the pinhole array 6 is formed by arranging the pinholes 6a in rows periodically in the X and Y directions at a period (pitch) Ps/β. Here, "β" is the projection magnification of the projection optical system PO, and "Ps" is the period in each of the X and Y direction of an image of the pinhole array 6 (image 6aP of the plurality of pinholes) formed by the projection optical system PO. Note that the period of the pinhole array 6 in the X direction may be different from that in the Y direction. The diameter of each of the pinholes 6a is, as an example, about not more than the diffraction limit. By using wavelength "λ" of the illumination light EL and numerical aperture "NAin" of the projection optical system PO on the object side, the diffraction limit is expressed as "λ/(2NAin)".

$$\text{The diameter of pinhole } 6a \leq \lambda/(2\text{NAin}) \tag{A1}$$

Here, provided that the wavelength λ is 193 nm and the numerical aperture NAin is approximately 0.25, then the diffraction limit is approximately 400 nm. Accordingly, the diameter of the pinhole 6a is, for example, about 400 nm or smaller than this. Actually, it is possible to measure the wavefront aberration of the projection optical system PO by using only one piece of the pinhole 6a. However, by using the pinhole array 6 in which a large number of the pinholes 6a are periodically formed in such a manner, the light amount of the interference fringe on the imaging element 14 becomes great, which in turn makes it possible to measure the wavefront by the shearing interference system with a high S/N ratio.

Further, the period Ps/β of the pinhole array 6 is, for example, not less than the spatial coherence length of the illumination light EL. By using numerical aperture "NAIL" of the illumination optical system on the light-exit side and the wavelength "λ", the spatial coherence length is, as an example, expressed as "λ/NAIL", at most. Therefore, it is enough if the period Ps/β satisfies the following condition.

$$Ps/\beta \geq \lambda/\text{NAIL} \approx \lambda/\text{NAin} \tag{A2}$$

In this case, provided that the wavelength λ is 193 nm and the numerical aperture NAin is 0.25, then the spatial coherence length is approximately 800 nm. Accordingly, it is enough if the period Ps/β is, for example, greater than about 800 nm. Note that, however, a period Ps of an image of the pinhole array 6 needs to further satisfy a predetermined condition, as will be described later on, and that the period Ps is, for example, not less than about 1 μm. In such a case, provided that the projection magnification β is ¼, the period Ps/β of the pinhole array 6 is approximately not less than about 4 μm, thereby sufficiently meeting the condition of the expression (A2).

Further in FIG. 2(A), the image of the pinhole array 6 by the projection optical system PO is formed on an image plane 18, the diffraction grating 10 is arranged at a position spaced in −Z direction from the image plane 18 by a distance Lg, and a light-receiving surface of the imaging element 14 is arranged below the diffraction grating 10 at a position spaced from the image plane 18 by a distance Lc. The diffraction grating 10 is obtained by periodically forming grating pattern units 11S in the X and Y directions in a light-shielding film 10b made of a metal film, etc., provided on a surface of a flat plate-shaped glass substrate.

As shown in FIG. 2(C), a two-dimensional grating pattern unit DP1 is formed in the light-shielding film 10b of the diffraction grating 10 by arranging a plurality of grating pattern units 11S with a period "Pg" in the X and Y directions. Actually, the number of arranged (aligned) rows of the grating pattern units 11S in the X and Y directions inside the grating pattern DP1 is considerably greater than that depicted in FIG. 2(C). Each of the grating pattern units 11S is obtained by forming, in a light-shielding film 10b, a large number of rectangular (may be square) opening patterns 11Sa having different or various dimensions or sizes such that average transmittance distributions in the X and Y directions are each a change (changed) substantially corresponding to one period of a sinusoidal distribution (a sinusoidal-shaped distribution). Accordingly, the distribution of average transmittance "TY" in the Y direction of the diffraction grating 10 (grating pattern DP1) is a distribution having a sinusoidal shape with the period Pg, as depicted in FIG. 2(D). Similarly, the distribution of average transmittance "TX" in the X direction of the diffraction grating 10 is also a distribution having a sinusoidal shape with the period Pg. Note that the period of the sinusoidal transmittance distribution in the X direction of the diffraction grating 10 may be different from that in the Y direction. As described above, since the grating pattern D1 has the sinusoidal transmittance distribution, as the transmittance distribution thereof, the grating pattern DP1 may be referred to as "pseudo-sinusoidal grating pattern". In the following, the grading pattern DP1 is referred to as the pseudo-sinusoidal grating pattern DP1 in some cases.

FIG. 3(A) shows one grating pattern unit 11s among the grating pattern units 11S in the diffraction grating 10. The transmittance distribution of the grating pattern unit 11S equals to the product of a sinusoidal transmittance distribution of a one-dimensional grating pattern unit 11SX formed in the X direction with the period Pg as depicted in FIG. 3(B) and a sinusoidal transmittance distribution of a one-dimensional grating pattern unit 11SY formed in the Y direction with the period Pg as depicted in FIG. 3(C). The grating pattern unit 11SX is a pattern in which one period of the pattern is divided into seven portions (7-division pattern) by arranging seven pieces of a partial pattern formed of a light-shielding portion LXA having a line width Li (i=1 to 7) and a light-transmitting portion SXA having a line width Si in the X direction while gradually changing a line width ratio (Li/Si). Similarly, the grating pattern unit 11SY is a 7-division pattern formed by arranging seven pieces of a partial pattern formed of a light-shielding portion LYA having a line width Li (i=1 to 7) and a light-transmitting portion SYA having a line width Si in the Y direction. An example of the line width Li and the line width Si of the seven partial patterns of the grating pattern units 11SX and 11SY is indicated in a table on the left side of FIG. 4(A). Each of the partial patterns has a constant width that is 1.143 nm and the period Pg that is approximately 8 μm (=1.143 nm×7).

Further, as the number of divided portions in (within) one period of each of the grating pattern units 11SX, 11SY is made greater, the transmittance distribution can be made closer to the sinusoidal wave (sinusoidal shape). Accordingly, it is allowable that a 9-division or 11-division pattern in which one period (here, 8 μm) is divided into 9 portions or 11 portions is used as each of the grating pattern unit 11SX, 11SY, and that the transmittance distribution of the grating pattern unit 11S is the product of the transmittance distribution of the grating pattern unit 11SX that is the 9-division pattern or 11-division pattern and the transmittance distribution of the grating pattern unit 11SY that is the 9-division pattern or 11-division pattern. A table in the center of FIG. 4(A) indicates an example of the line width Li of the light-shielding portion and the line width Si of the light-transmitting portion in a case that the pattern is divided into 9 portions, and a table on the right side of FIG. 4(A) indicates an example of the line width Li of the light-shielding portion and the line width Si of the light-transmitting portion in a case that the pattern is divided into 11 portions. Further, in the line widths Li and Si in FIG. 4(A), the minimum line width of the light-transmitting portion is 100 nm.

Furthermore, FIG. 4(B) indicates a result of calculation of the intensities (diffraction intensities) of 0th order light and diffracted lights such as 1st order, 2nd order, 3rd order diffracted lights, etc. generated from the pseudo-sinusoidal grating pattern DP1 of the diffraction grating 10 brought about by irradiation with the illumination light EL. FIG. 4(B) indicates the diffraction intensities in a case of using, as the grating pattern units 11S of the pseudo-sinusoidal grating pattern DP1, the patterns in each of which one period thereof is divided into 7, 9 or 11 portions. From the diffraction intensities, it is appreciated that in a case of using the patterns in each of which one period is divided into 7, 9 or 11 portions, 7th order, 9th order and 11th order diffracted lights are also generated respectively, in addition to the 0th order light and 1st order diffracted light.

With respect to this, FIG. 4(C) indicates a result of calculation of the degree of coherence between the 0th order light and the other diffracted lights, such as 1st, 2nd, 3rd order diffracted lights, etc., from the diffraction grating 10, in a case that light beam(s) from a periodic surface light source such as the pinhole array 6 depicted in FIG. 2(B) is/are made to come into the diffraction grating 10 via the projection optical system PO. As indicated in FIG. 4(C), it is appreciated that as the order of diffracted light is greater, the degree of coherence is lowered. What is required for the shearing interference is an interference fringe generated by interference between the 0th order light and the ±1st order diffracted lights; it is preferable there are not much other interference fringes that are different from the interference fringe between the 0th order light and the ±1st order diffracted lights. As indicated in FIG. 4(B), the diffraction intensities generated from the grating pattern units 11S are such that in the 7-division, 9-division and 11-division patterns, the diffraction intensities of the 7th, 9th and 11th order diffracted lights are great, respectively. On the other hand, as indicated in FIG. 4(C), in a case that the light beam is made to come into the diffraction grating 10 via the pinhole array 6 as depicted in FIG. 2(B) and the projection optical system PO as described above, the degree of coherence between the 0th order light and the 7th, 9th and 11th order diffracted lights generated from the diffraction grating 10 becomes low. Accordingly, the intensities of interference fringes generated by interference between the 0th order light and the 7th, 9th and 11th order diffracted lights are considerably small, which in turn makes that effective diffracted lights generated from the pseudo-sinusoidal grating pattern DP1 of the present embodiment are substantially only the 0th order light and 1st order diffracted light, thereby making it possible to considerably lower the ratio of noise light and thus to perform the measurement of shearing wavefront with high accuracy.

In this embodiment, the number of partial patterns inside one period of each of the grating pattern units 11S may be an odd number or even number. Depending on the measurement accuracy required, the number of partial patterns in one period may be set to an odd or even number. Further, although the widths of the respective partial patterns in one period are same in the example indicated in FIG. 4(A), it is also possible to gradually change the widths of the plurality of partial patterns.

Further, it is allowable to use a grating pattern unit 11SA as depicted in FIG. 5(A), instead of using the grating pattern unit 11S depicted in FIG. 3(A); in the grating pattern unit 11SA depicted in FIG. 5(A), the rectangular opening patterns 11Sa having various dimensions and constructing the grating pattern unit 11S depicted in FIG. 3(A) are replaced by circular opening patterns 11SAa having various dimensions which are same as the various dimensions of the rectangular opening patterns 11Sa, respectively. Furthermore, although the transmittance distribution of the grating pattern unit 11S is the product of the transmittance distribution of the grating pattern unit 11SX in the X direction and the transmittance distribution of the grating pattern unit 11SY in the Y direction, it is allowable to use a grating pattern unit 11SB having a sinusoidal transmittance distribution which is a sum of the transmittance distribution of the grating pattern unit 11SX in the X direction and the transmittance distribution of the grating pattern unit 11SY in the Y direction, as depicted in FIG. 5(B). The grating pattern unit 11SB is formed in the following manner: namely, a pattern which is the sum of the transmittance distributions of the grating pattern units 11SX and 11SY is prepared, then the rectangular opening patterns inside the pattern are replaced by circular opening patterns 11SBa which have same various dimension as those of the rectangular opening patterns, and then the rectangular light-shielding patterns inside the pattern are replaced by circular light-shielding patterns 11SBb which have same various dimensions as those of the rectangular light-shielding patterns, respectively.

In FIG. 2(A), the illumination light EL passed through the pinhole array 6 comes into the diffraction grating 10 via the projection optical system PO, and an interference fringe of shearing interference (Fourier image) 22 as depicted in FIG. 2(E) is formed on the light-receiving surface of the imaging element 14 by the interference among a 0th order light (0th order diffracted light) 20, ±1 order diffracted lights in the X direction (not depicted), ±1 order diffracted lights in the Y direction 20A, 20B, etc., generated from the pseudo-sinusoidal grating pattern DP1 of the diffraction grating 10.

The period Pg of the diffraction grating 10 is set depending on a desired lateral shift amount (shear amount) of diffracted lights, and is set, for example, to be about 1 μm to about 10 μm. In three examples indicated in FIG. 4(A), the period Pg is set to be 8 μm.

In order that the interference fringe 22 is formed on the light-receiving surface of the imaging element 14 in this case, it is necessary that the distance Lg between the image plane 18 and a pattern-formation surface of the diffraction grating 10 in which the pseudo-sinusoidal grating pattern DP1 is formed and the distance Lc between the image plane 18 and the light-receiving surface of the imaging element 14 satisfy the following condition (Talbot condition) by using the exposure wavelength $\lambda$, the period Pg of the diffraction grating 10, and a Talbot order n. Note that the specifics of the Talbot condition are described in "Ouyou Kougaku 1" (Applied Optics 1; author: Tadao Tsuruta; publisher: Baifukan, Co. Ltd., 1990, pp. 178-181).

$$(1/Lg)+\{1/(Lc-Lg)\}=\lambda/(2nPg^2) \tag{A3}$$

Note that in the expression (A3), n=0, 0.5, 1, 1.5, 2, . . . Namely, the Talbot order n is an integer or half-integer.

In the embodiment, since Lc>>Lg holds, the following approximation can be used, instead of the expression (A3).

$$Lg=2n\times Pg^2/\lambda \tag{A4}$$

Further, in order that the interference fringe is formed on the imaging element 14 in high contrast, it is necessary that the period Ps of an image of the pinhole array 6 satisfies the following condition by using the period Pg, the distance Lg, the distance Lc and a predetermined integer "m" (for example, 2 or 4). The condition is disclosed, for example, in Japanese Patent Application Laid-open No. 2011-108696.

$$Ps=\{Pg/(1-Lg/Lc)\}m \tag{A5}$$

This condition is a condition by which, when a light beam E1 from an image 6aP of one pinhole among the pinhole array 6 arrives to a certain point 22a on the interference fringe 22 on the imaging element 14, a light beam E2 from an image 6a P of another pinhole also arrives to the point 22a. In other words, an interference fringe 22 having a high contrast is formed by this condition.

Note that since Lg/Lc is a value considerably smaller than 1, it is possible to use the following approximation, instead of using the expression (A5).

$$PS=Pg\times m \tag{A6}$$

In this expression, provided that the period Pg is 8 μm and m is 2, the period Ps of the image of the pinhole array 6 is 16 μm. In this case, provided that the projection magnification $\beta$ is made to be ¼, the period of the pinhole array 6 is 64 μm.

Under the conditions of the expressions (A4) and (A6), information on intensity distribution of the interference fringe 22 formed on the light-receiving surface of the imaging element 14 is inputted to the arithmetic unit 12 depicted in FIG. 1, and then the inputted information on intensity distribution is subjected to the calculation to be described later on. By doing so, it is possible to obtain a shearing wavefront (hereinafter referred to as the "shear wavefront in the X direction") Wx between the wavefront of the projection optical system PO and a wavefront obtained by shifting the wavefront of the projection optical system PO in the X direction, and to obtain a shearing wavefront (hereinafter referred to as the "shear wavefront in the Y direction") Wy between the wavefront of the projection optical system PO and a wavefront obtained by shifting the wavefront of the projection optical system PO in the Y direction. Further, the arithmetic unit 12 obtains the wavefront of the projection optical system PO from these shear wavefronts Wx and Wy, consequently the wavefront aberration thereof and supplies the information on wavefront aberration (wavefront aberration information) to the main control system 16.

Figure 7:
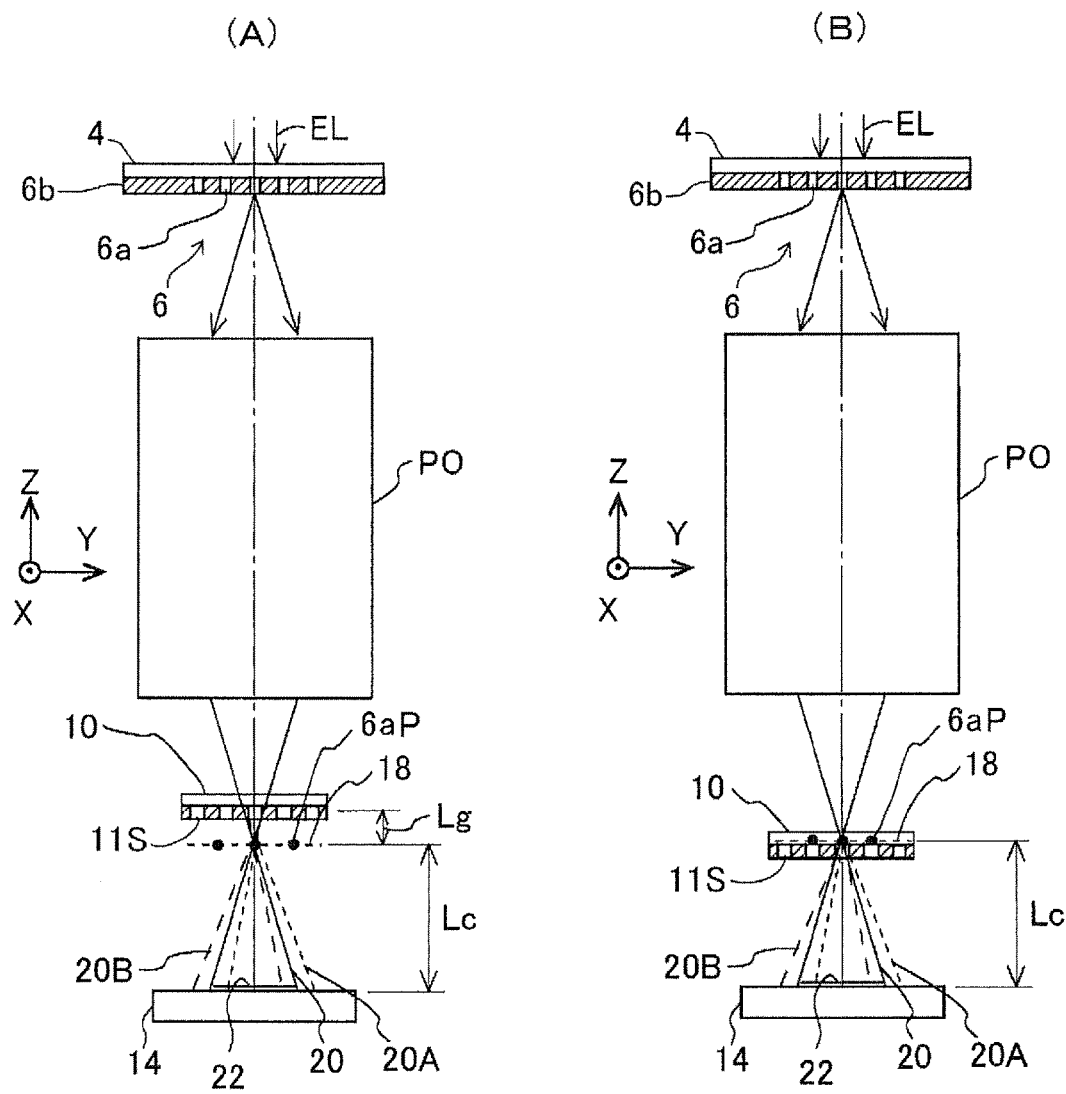
FIG. 7(A) is a view depicting a first modification of the measurement device body.
FIG. 7(B) is a view depicting a second modification of the measurement device body.

Note that as depicted by a first modification of the measurement device body of FIG. 7(A), it is also possible to arrange the pattern of the diffraction grating 10 at the position above the image plane 18 of the projection optical system PO to be spaced therefrom by the distance Lg. In such a case, the distance Lg may be handled as a negative number.

Further, in a case of using an ultraviolet light such as the ArF excimer laser beam (wavelength: 193 nm) as the illumination light EL as in the present embodiment, it is also possible to arrange the pattern of the diffraction grating 10 on the image plane 18 of the projection optical system PO as depicted by a second modification of FIG. 7(B). In such a case, there is no need to satisfy the Talbot condition described above.

In the following, an example of an operation for measuring the wavefront aberration of the projection optical system PO by using the wavefront measuring device 80, in the exposure apparatus EX of the present embodiment, will be explained with reference to the flowchart of FIG. 6. The measuring operation is controlled by the main control system 16. In this embodiment, as an example, the phase shift method is used to obtain the shearing wavefront. The phase shift method is disclosed, for example, in Japanese Patent Application Laid-open No. 2011-108696. Note that the shearing wavefront can be obtained also by the Fourier Transformation method.

Figure 6:
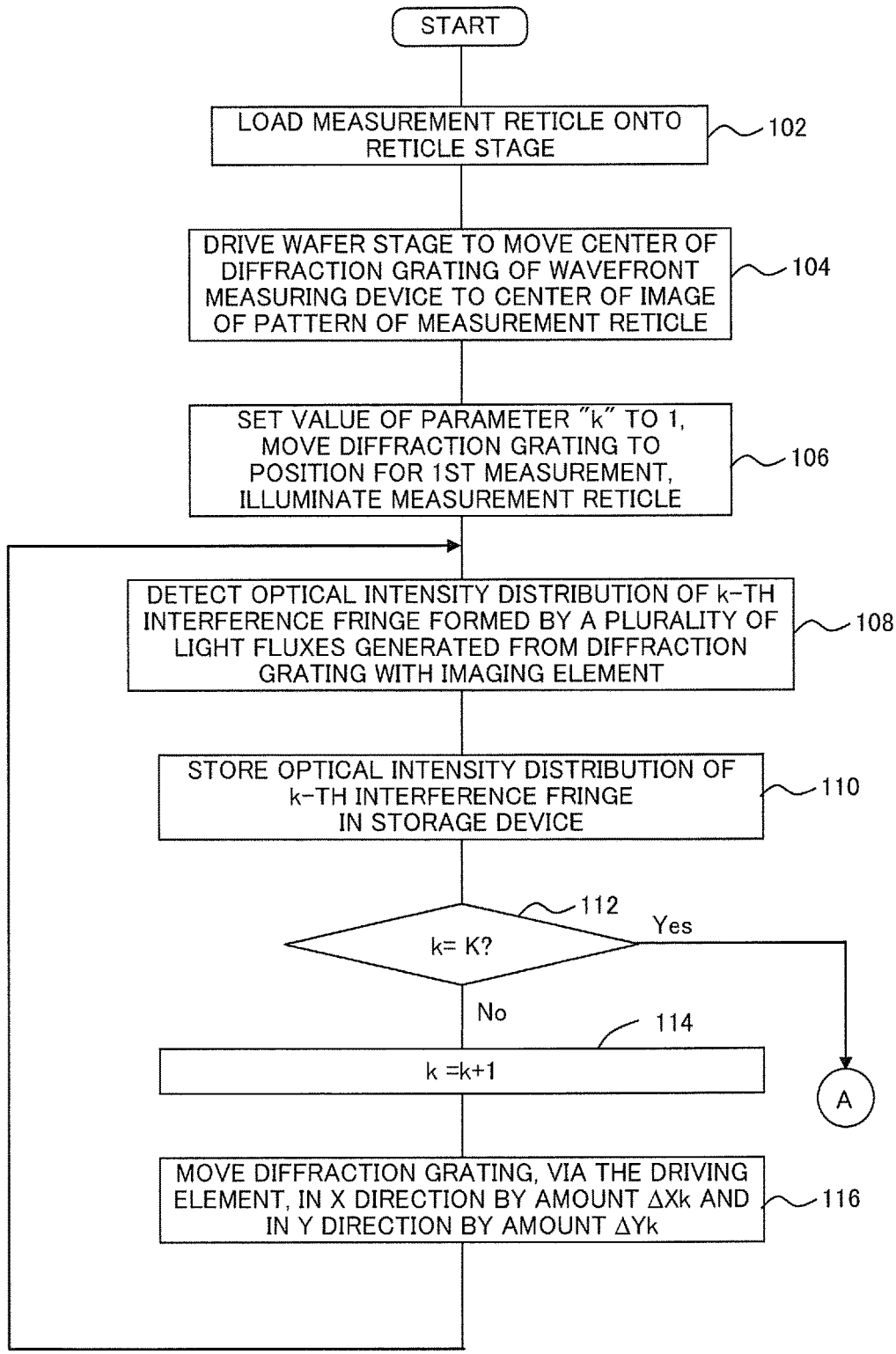
FIG. 6 is a flow chart of an example of an operation for measuring the wavefront aberration of the projection optical system PO.

At first, in Step 102 of FIG. 6, the measurement reticle 4 is loaded onto the reticle stage RST of FIG. 1, and the pinhole array 6 of the measuring reticle 4 is moved to the illumination area of the illumination system ILS. Then, the wafer stage WST is driven so as to move the center of the diffraction grating 10 of the measurement device body 8 to the center of the image of the pinhole array 6, as depicted in FIG. 2(A) (Step 104).

Next, the main control system 16 resets the value of a control parameter "k" to 1, uses the driving element 9 to set a movement amount (phase shift amount) of the diffraction grating 10 in the X and Y directions to be a value of a first measurement point, and allows the measurement reticle 4 to be illuminated with the illumination light EL from the illumination system ILS (Step 106). Then, the illumination light EL exited from the measurement reticle 4 comes into the diffraction grating 10 via the projection optical system PO; and intensity distribution Ik, of the interference fringe 22 formed by a k-th (here, 1st) shearing interference among the plurality of diffracted lights generated from the diffraction grating 10 and including the 0th order light, is detected by the imaging element 14 (Step 108). A result of the detection is stored in a storage device in the arithmetic unit 12 (Step 110).

Next, the main control system 16 judges whether or not the parameter k has reached a value "K" indicating a predetermined number of measuring times (for example, an integer of not less than 4) (Step 112); in a case that the parameter k is smaller than "K", the main control system 16 causes the operation to proceed to Step 114, and the main control system 16 adds 1 to the value of the parameter k. Then, the main control system 16 causes the diffraction grating 10 of the measurement device body 8 to move, via the driving element 9, in the X direction by an amount ΔXk and in the Y direction by an amount ΔYk, and adjusts the phase shift amount to a value at the k-th measurement point (Step 116). Afterwards, the main control system 16 causes the operation to return to Step 108; and the main control system 16 repeats the operation for detecting the intensity distribution Ik, of the k-th interference fringe 22 formed by the shearing interference among the diffracted lights generated from the diffraction grating 10, and the operation for storing the optical intensity distribution (Step 110).

Then, in Step 112, in a case that the parameter k has reached K, the operation proceeds to Step 118. Afterwards, the arithmetic unit 12 reads K-pieces of information on the intensity distribution Ik (k=1 to K) of the interference fringes from the internal storage device thereof, and uses the K pieces of the information on the intensity distribution Ik of the interference fringes to calculate the shear wavefronts Wx and Wy in the X and Y directions, respectively. The method for calculating the shear wavefronts is disclosed, for example, in Japanese Patent Application Laid-open No. 2011-108696. The shear wavefronts are phase distributions calculated for every detection signal (optical intensity) from each pixel in the imaging element 14.

Then, the arithmetic unit 12 obtains the wavefront of the illumination light passed via the projection optical system PO from the shear wavefronts in the X and Y directions, and further obtains the wavefront aberration from the wavefront (Step 120). The information on the wavefront aberration obtained in Step 120 is supplied to the main control system 16. Further, the main control system 16 corrects the wavefront aberration of the projection optical system PO, as necessary, by using the imaging characteristic correcting device 2 (Step 122). Afterwards, a reticle R for actual exposure operation is loaded onto the reticle stage RST (Step 124), and a plurality of shot areas of each of wafers successively placed on the wafer stage WST are subjected to the scanning exposure with the image of the pattern of the reticle R (Step 126).

In the above measurement, the majority of diffracted lights exited from the pseudo-sinusoidal grating pattern DP1 of the diffraction grating 10 are 0th order light and ±1st order diffracted lights and the amounts of the higher order interference lights are considerably lowered, thereby making it possible to measure the wavefront aberration of the projection optical system PO by the wavefront measuring device 80 with high accuracy. Accordingly, the imaging characteristic of the projection optical system PO can be maintained always in a desired state, realizing an exposure with high accuracy.

The effects, etc. of the present embodiment are as follows.

The exposure apparatus EX of the embodiment is provided with the wavefront measuring device 80 which obtains the wavefront information of the projection optical system PO based on the light beam exited from the pinhole array 6 of the measurement reticle 4. The wavefront measuring device 80 is provided with the diffraction grating 10 into which the light beam exited from the pinhole array 6 and passed via the projection optical system PO come, and which has the periodicities in the X and Y directions, and in which transmittance distributions in the X and Y directions are sinusoidal-shaped; the imaging element 14 (detector) which detects the intensity distribution of the interference fringe 22 formed by the plurality of light beams generated from the diffraction grating 10; and the arithmetic unit 12 which obtains the wavefront information of the projection optical system PO based on the result of detection by the imaging element 14.

Further, the wavefront measuring method for obtaining the wavefront information of the projection optical system PO by using the wavefront measuring device 80 includes: Step 106 of irradiating the projection optical system PO with light beam exited from the pinhole array 6 of the measurement reticle 4; Step 108 of causing the light beam passed via the projection optical system PO to come into the diffraction grating 10 which has the periodicities in the X and Y directions and in which transmittance distributions in the X and Y directions are sinusoidal-shaped; and Step 120 of obtaining the wavefront information of the projection optical system PO based on the interference fringe 22 formed by a plurality of light beams generated from the diffraction grating 10.

According to the embodiment, the 0th order light and ±1st order diffracted lights are mainly generated from the pseudo-sinusoidal grating pattern DP1 of the diffraction grating 10, and the intensities of the higher order diffraction lights, which are 2nd order or higher diffracted lights, are considerably lowered. Accordingly, the shear wavefronts in the X and Y directions of the projection optical system PO can be measured with high accuracy based on the intensity distribution of the interference fringe formed by the 0th order light and the 1st order light generated from the diffraction grating 10. Therefore, the wavefront information of the projection optical system PO can be measured effectively and highly accurately, while lowering any effect from the higher order interference lights, etc.

Further, the exposure method of the embodiment is an exposure method including illuminating the pattern of the reticle R with the illumination light EL (exposure light) and exposing a wafer W (substrate) with the illumination light EL via the pattern and the projection optical system PO, wherein the wavefront measuring method of the embodiment is used to measure the wavefront aberration of the projection optical system PO. Furthermore, the exposure apparatus EX of the embodiment is provided with the wavefront measuring device 80 so as to measure the wavefront aberration of the projection optical system PO.

Accordingly, the wavefront aberration of the projection optical system PO of the exposure apparatus can be evaluated at the exposure wavelength with high accuracy. Further, by correcting the measured wavefront aberration, the exposure can be performed with high accuracy. Further, by using the result of measurement of the wavefront aberration for alignment of respective optical members or elements in the projection optical system PO, a projection optical system with high performance can be produced. Furthermore, in the exposure apparatus EX, the wavefront aberration of the projection optical system PO can be measured on-body and in the full filed of the projection optical system PO, with high accuracy.

Note that this embodiment may be modified as follows.

Firstly, the pseudo-sinusoidal grating pattern Dpi of the diffraction grating 10 of the embodiment is a two-dimensional pattern having the periodicities in the X and Y directions. In a case that it is sufficient to obtain, for example, the shear wavefront in the X direction of the projection optical system PO, it is possible to use, as the pseudo-sinusoidal grating pattern, a pattern in which the grating pattern units 11SX in the X direction of FIG. 3(B) are periodically arranged in the X direction. Similarly, in a case that it is sufficient to obtain the shear wavefront in the Y direction, it is possible to use, as the pseudo-sinusoidal grating pattern, a pattern in which the grating pattern units 11SY in the Y direction of FIG. 3(C) are periodically arranged in the Y direction.

Figure 8:
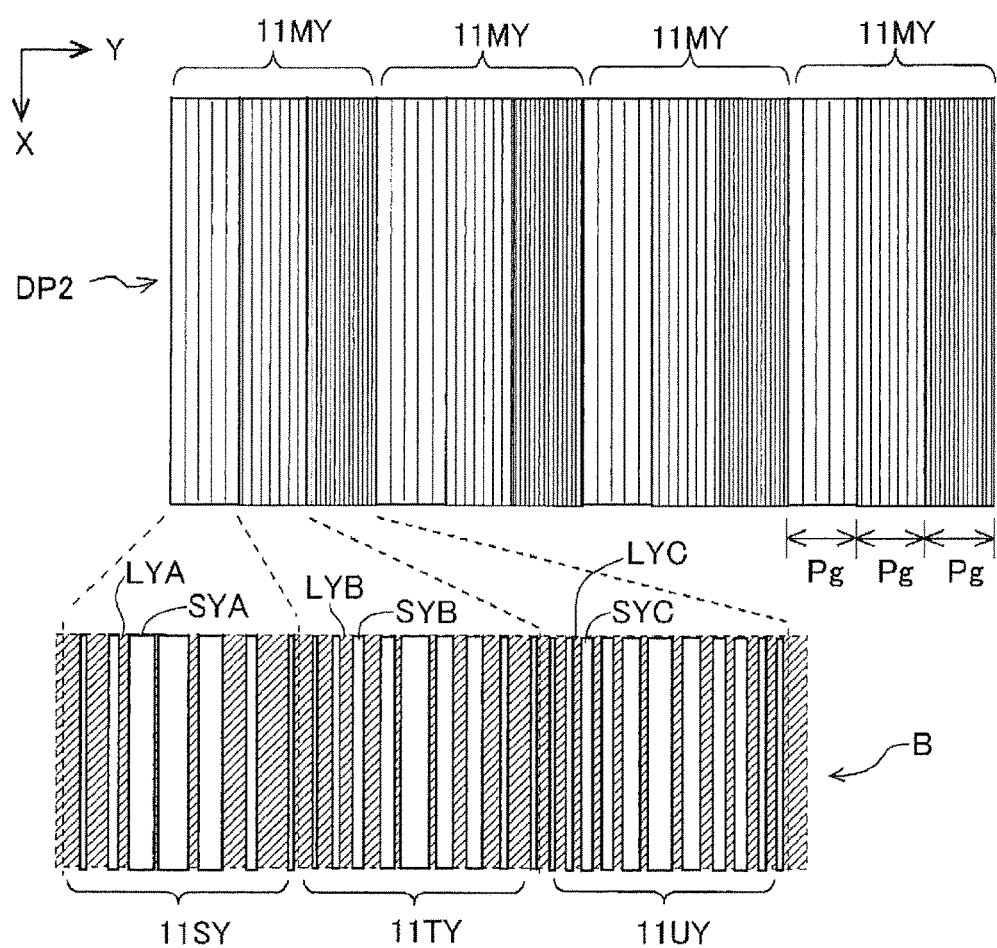
FIG. 8 is an enlarged view depicting a portion of a diffraction grating pattern of a first modification.

Also, it is allowable to use, as the pattern for the diffraction grating 10 of FIG. 2(A), a pseudo-sinusoidal grating pattern DP2 of a first modification depicted in FIG. 8. The pseudo-sinusoidal grating pattern DP2 is a pattern obtained by forming a plurality of grating pattern units 11MY in the Y direction at a period 3Pg. In this case, the average transmittance distribution in the Y direction of the pseudo-sinusoidal grating pattern DP2 has a sinusoidal shape with the period Pg. Each of the grating pattern units 11MY is a three mixture pattern composed by arranging three kinds of grating pattern units in the Y direction, the three grating pattern units being:

a grating pattern unit 11SY formed of a partial pattern (light-shielding portion LYA and light-transmitting portion SYA) by which one period Pg of the sinusoidal transmittance distribution is divided into seven portions;

a grating pattern unit 11TY formed of a partial pattern (light-shielding portion LYB and light-transmitting portion SYB) by which one period Pg is divided into nine portions; and a grating pattern unit 11UY formed of a partial pattern (light-shielding portion LYC and light-transmitting portion SYC) by which one period Pg is divided into eleven portions, as depicted by an enlarged view "B" in FIG. 8.

The intensities of the diffracted lights generated from the pseudo-sinusoidal grating pattern DP2 (three mixture pattern) are such that the intensities of the 0th order light and 1st order diffracted light are great, and the intensities of the higher order diffraction lights, which are 2nd order or higher diffracted lights, are substantially 0 (zero), as indicated in FIG. 4(B). Accordingly, in a case of measuring the shearing wavefront by arranging the diffraction grating having the pseudo-sinusoidal grating pattern DP2 formed therein on the side of the image plane of the projection optical system PO, the noise of the higher-order interference lights in the formed interference fringe is substantially 0 (zero), and thus the shearing wavefront can be measured with a very high accuracy.

Figure 9:
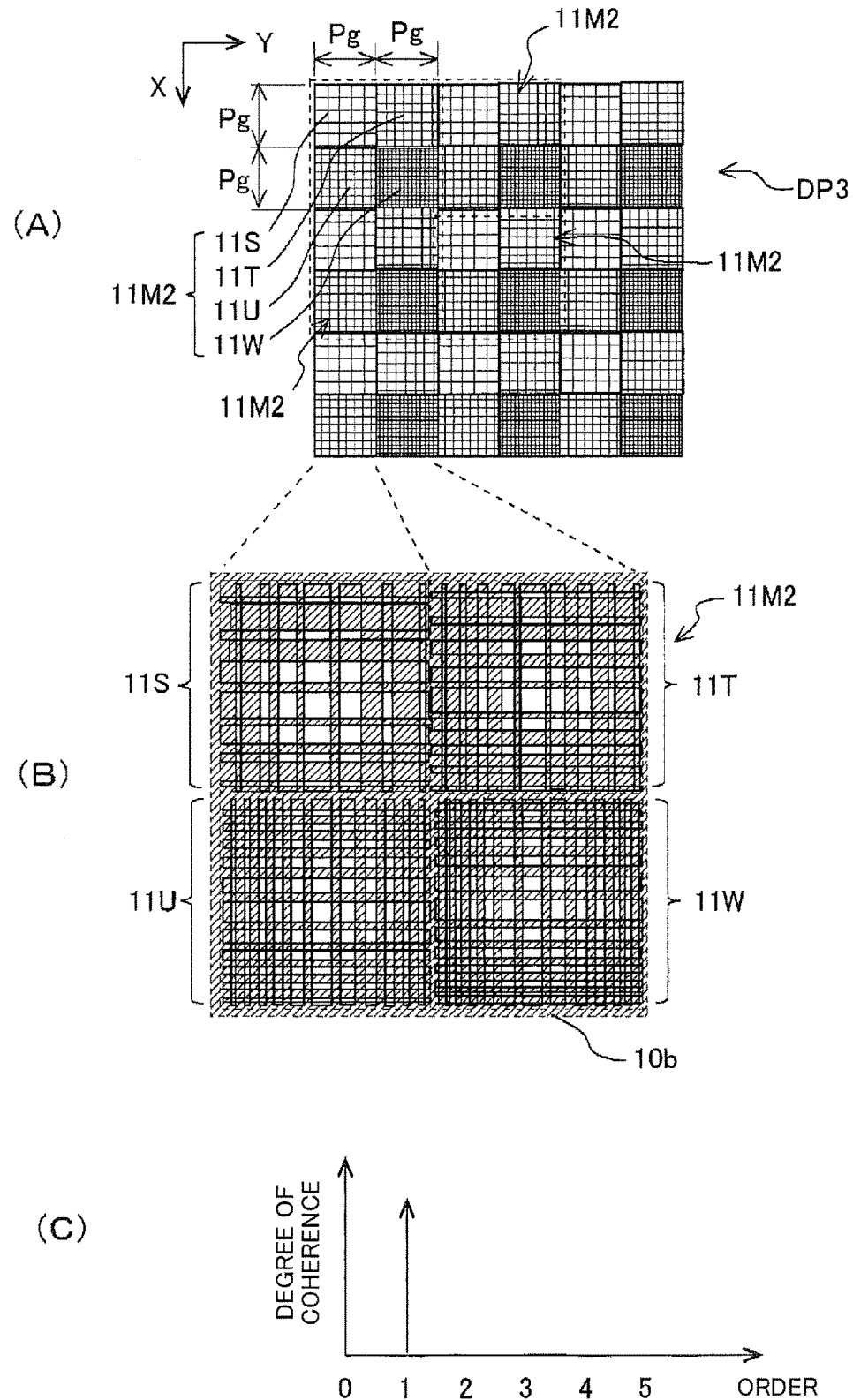
FIG. 9(A) is an enlarged view depicting a portion of a diffraction grating pattern of a second modification.
FIG. 9(B) is an enlarged view depicting the grating pattern unit in FIG. 9(A)
FIG. 9(C) is a view indicating an example of the degree of coherence among diffracted lights.
Figure 10:
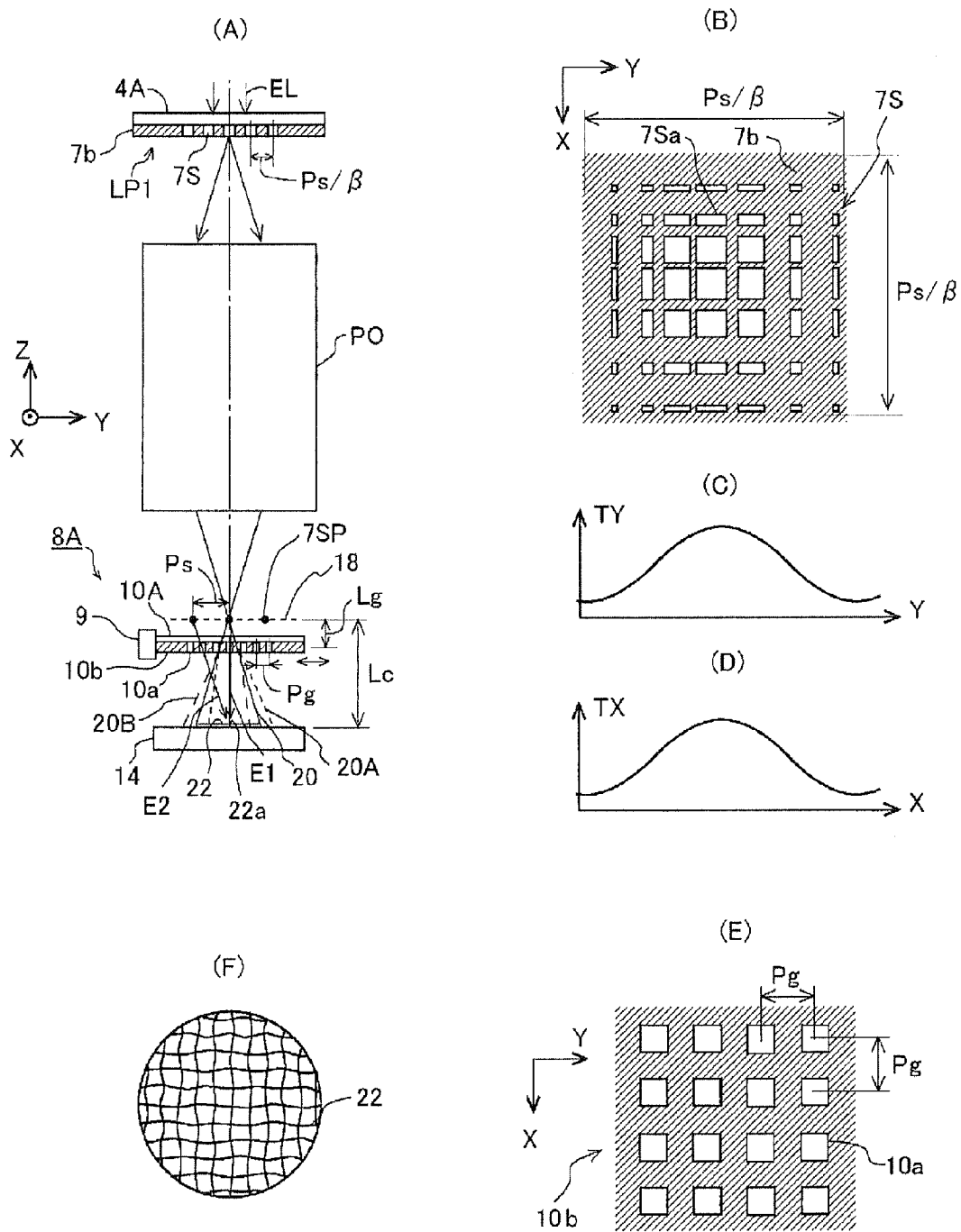
FIG. 10(A) is a view depicting a projection optical system Pb and a measurement device body BA according to a second embodiment.
FIG. 10(B) is an enlarged view of a light-exit pattern unit of FIG. 10(A)
FIG. 10(C) is a view depicting the transmittance distribution in Y direction of a grating pattern unit.
FIG. 10(D) is a view depicting the transmittance distribution in X direction of the grating pattern unit.
FIG. 10(E) is an enlarged view depicting a portion of the diffraction grating of FIG. 10(A)
FIG. 10(F) is a view depicting an example of an interference fringe in FIG. 10(A).
Figure 11:
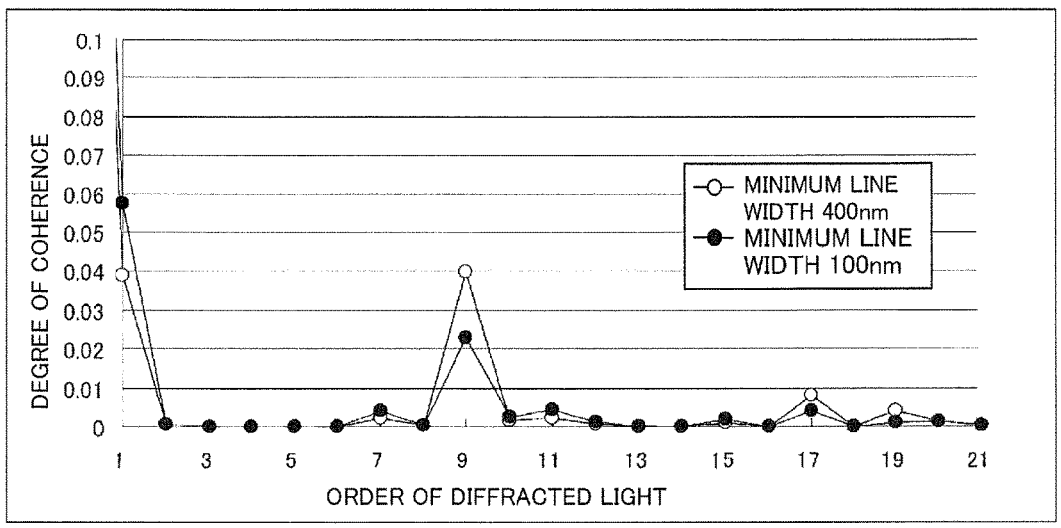
FIG. 11(A) is a view depicting an example of the combination of line widths of light-shielding portions and light-transmitting portions of two kinds of light-exit pattern units.
FIG. 11(B) is a view indicating the degree of coherence among diffracted lights exiting from the light-exit pattern.

Also, it is allowable to use, as the pattern for the diffraction grating 10 of FIG. 2(A), a pseudo-sinusoidal grating pattern DP3 of a second modification depicted in FIG. 9(A). The pseudo-sinusoidal grating pattern DP3 is a pattern obtained by forming a plurality of grating pattern units 11M2 in the X and Y direction each at a period 2Pg. In this case, the average transmittance distributions in the X and Y directions of the pseudo-sinusoidal grating pattern DP3 each have a sinusoidal shape with the period Pg. Each of the grating pattern units 11M2 is a two-dimensional, four mixture pattern composed by arranging four kinds of grating pattern units in the X and Y directions, the four grating pattern units being:

a two-dimensional grating pattern unit 11S corresponding to the product (or may be the sum) of partial patterns in each of which one period Pg of the sinusoidal transmittance distribution in the X or Y direction is divided into seven portions;

a two-dimensional grating pattern unit 11T corresponding to the product (or may be the sum) of partial patterns in each of which one period Pg is divided into nine portions;

a two-dimensional grating pattern unit 11U corresponding to the product (or may be the sum) of partial patterns in each of which one period Pg is divided into eleven portions; and a two-dimensional grating pattern unit 11W corresponding to the product (or may be the sum) of partial pattern in each of which one period Pg is divided into thirteen portions, as depicted by an enlarge view of FIG. 9(B).

The intensity of the diffracted lights generated from the two-dimensional pseudo-sinusoidal grating pattern DP3 (four mixture pattern) is such that the intensities of the higher order diffraction lights, which are 2nd order or higher diffracted lights, are substantially 0 (zero) in both of the X and Y directions, as depicted in FIG. 9(C). Accordingly, in a case of measuring the shearing wavefront by arranging the diffraction grating, which is formed with the pseudo-sinusoidal grating pattern DP3, on the side of the image plane of the projection optical system PO, the noise of the higher-order interference lights in the formed interference fringe is substantially 0 (zero), and thus the shearing wavefronts in the X and Y directions can be measured with very high accuracy.

Note that the embodiment described above is applicable also to an incoherent illumination measuring system using a periodic surface light source, as well as to a coherence illumination measuring system using a single pinhole.

Second Embodiment

Next, a second embodiment of the present teaching will be explained with reference to FIG. 10(A) to FIG. 11(B). The basic configuration of a wavefront aberration measuring device of the second embodiment is similar to that of the wavefront measuring device 80 of FIG. 1, except that in the second embodiment, a pattern of a measurement reticle has a transmittance distribution having a sinusoidal shape and that a plurality of ordinary opening patterns are formed in a diffraction grating. In the following explanation with reference to FIG. 10(A) to FIG. 11(B), part or portions corresponding to those depicted in FIGS. 2(A) to 2(D) are designated with same reference numerals as those used in FIGS. 2(A) to 2(D), any detailed explanation of which will be omitted or simplified.

FIG. 10(A) is a view depicting a measuring device body 8A and a measurement reticle 4A of the wavefront aberration measuring device, and the projection optical system PO of the second embodiment. In the second embodiment, the measurement reticle 4A has a configuration wherein a plurality of light-exit pattern unit 7S are arranged in rows in the X and Y directions at a period Ps/β (here, 'β' is the projection magnification of the projection optical system PO), thereby forming a grating pattern LP1 (hereinafter referred to as "pseudo-sinusoidal grating pattern") of which average transmittance distributions in the X and Y directions are a sinusoidal transmittance distribution with the period Ps/β. As depicted in FIG. 10(B), each of the light-exit pattern units 7S is obtained by forming a plurality of rectangular (may be square) opening patterns 7Sa having different or various dimensions or sizes in a light-shielding film 7b, in a similar manner with the grating pattern units 11S of the diffraction grating 10 of FIG. 2(C). The average transmittance distributions "TY" and "TX" in the Y and X directions, respectively, of the light-exit pattern unit 7S are each a distribution having a sinusoidal shape with a period "Ps/β", as depicted in FIGS. 10(C) and 10(D), respectively.

Further, as depicted in FIG. 10(E), a diffraction grating 10A of the measuring device body 8A has square-shaped opening patterns 10a which are formed in a light-shielding film 10b and arranged in the X and Y directions at a period Pg. Accordingly, an interference fringe 22 (see FIG. 10(F)) by the interference among a 0th order light 20, +1st order diffracted light 20A, −1st order diffracted light 20B, etc. is formed on the light-receiving surface of an imaging element 14 of the measuring device body 8A.

FIG. 11(B) indicates a result of calculation of the degree of coherence between the 0th order light and the other diffracted lights, such as 1st, 2nd, 3rd order diffracted lights, etc., exited from the diffraction grating 10, in a case of using, in the second embodiment, a pattern formed of a partial pattern by which one period is divided into 9 portions, as the light-exit pattern unit 7S of the measurement reticle 4A depicted in FIG. 10(B). Regarding this case, FIG. 11(A) indicates an example of a line width Li (nm) of the light-shielding portion and a line width Si (nm) of the light-transmitting portion, the light-shielding portion and the light-transmitting portion being included in a portion obtained by dividing each of the light-exit pattern units 7S into 9 portions. An example on the right side of FIG. 11(A) indicates an example wherein the minimum line width is 100 nm, and an example on the left side of FIG. 11(A) indicates an example wherein the minimum line width is 400 nm. In these two examples, the line width of each of the partial patterns is approximately 3.556 nm and the period Ps/β is approximately 32 μm (=3.556 nm×9).

Further, FIG. 11(B) indicates the degree of coherence in a case of using the pseudo-sinusoidal grating pattern LP1 formed of the light-exit pattern units of which minimum line width are 100 nm and 400 nm, respectively. From FIG. 11(B), it is appreciated that the degree of coherence between the 0th order light and the 1st order light is great, and that the degree of coherence between the 0th order light and other diffracted lights which are different from the 9th order diffracted light is substantially 0 (zero). Furthermore, although the degree of coherence between the 0th order light and the 9th order diffracted light is relatively large, the intensity of the 9th order diffracted light generated from the diffraction grating 10A is considerably small. Accordingly, the higher order interference lights are considerably reduced. As a result, also in the second embodiment, the shear wavefronts in the X and Y directions of the projection optical system PO can be measured with the phase shift method or Fourier Transformation method, with a high accuracy.

Moreover, the wavefront measuring device of the second embodiment is provided with:

the measurement reticle 4A (light-exit section) having the light-exit pattern units 7S via which light beam(s) having, as a light amount distribution in the X and Y direction (or one direction of the X and Y directions), a sinusoidal distribution (or may be a distribution corresponding to one period of the sinusoidal distribution) is allowed to exit;

the diffraction grating 10A into which the light beam(s) exited from the measurement reticle 4A and passed via the projection optical system PO (light beam having been subjected to an irradiation step) comes (which executes the irradiation step) and which has the periodicities in the X and Y direction (or has the periodicity in one of X and Y directions);

the imaging element 14 (detector) which detects the intensity distribution of the interference fringe 22 formed by a plurality of light beams generated from the diffraction grating 10A; and an arithmetic unit (similar to the arithmetic unit 12 of FIG. 1) which obtains wavefront information of the projection optical system PO based on a result of detection by the imaging element 14 (which executes a step of obtaining the wavefront information).

According to the second embodiment, the light amount distribution of the light beam coming into the projection optical system PO have a sinusoidal distribution, and thus any effect of higher order diffracted lights, etc. exited from the diffraction grating 10A is lowered. Accordingly, the effect of the higher order interference lights, etc. is lowered and the wavefront information of the projection optical system PO can be measured with high accuracy.

Note that also in the second embodiment, it is allowable to use a one-dimensional pattern having a sinusoidal transmittance distribution in the X or Y direction, as the pseudo-sinusoidal grating pattern LP1 of the measurement reticle 4A. Further, as the pseudo-sinusoidal grating pattern LP1, it is allowable to use a mixture pattern formed by combining a plurality of light-exit pattern units (patterns corresponding to grating pattern units 11SY, 11TY and 11UY) which are mutually different in the number of divided portions in one period, as depicted in FIG. 8. Further, it is allowable to use a mixture pattern formed by combining a plurality of light-exit pattern units (patterns corresponding to grating pattern units 11S to 11W) which are mutually different in the number of divided portions in one period in the X and Y directions, as depicted in FIG. 9(A).

In a case of illuminating the diffraction grating 10A with the light beam from the pseudo-sinusoidal grating pattern composed of the mixture pattern as depicted in FIG. 9(A) (surface light source having the brightness or luminance distribution with a periodic sinusoidal shape) via the projection optical system PO, the degree of coherence between the 0th order light and the other diffracted lights, such as 1st order diffracted light, 2nd order diffracted lights, etc., from the diffraction grating 10, is as depicted in FIG. 9(C), namely such that the degree of coherence between the 0th order light and the 1st order diffracted light is great, and the degree of coherence between the 0th order light and the other diffracted lights different from the 1st order diffracted light is substantially 0 (zero). Accordingly, it is possible to measure the wavefront aberration of the projection optical system PO with the shearing interference method with further enhanced accuracy.

Note that the pattern of the diffracted grating 10A may be a checkered grating pattern. Further, in a state that the pseudo-sinusoidal grating pattern LP1 is provided on the measurement reticle 4A, it is also allowable to use a diffraction grating provided with a pseudo-sinusoidal grating pattern formed therein, as the diffraction grating 10A.

Further, in the second embodiment, it is allowable to use a light source (light-exit section) of which brightness distribution is sinusoidal-shaped, instead of using the measurement reticle 4A.

Note that the present teaching is applicable to a case of measuring the wavefront aberration of an optical system to be inspected, by detecting the interference fringe brought about by the shearing interference, etc with any interferometer different from the Talbot interferometer.

In the embodiments described above, the wavefront aberration of the projection optical system is measured in an exposure apparatus using a projection optical system constructed of a dioptric system or catadioptric system, etc., and using ArF excimer laser beam (wavelength: 193 nm) as the illumination light EL (exposure light) for exposure. However, the wavefront measuring method and device of the above-described embodiments are applicable also to a case of measuring the wavefront aberration of the projection optical system in an exposure apparatus (EUV exposure apparatus) which uses, as the exposure light, an EUV light (Extreme Ultraviolet Light) having a wavelength of about not more than 100 nm, for example, within a range of about 11 nm to about 15 nm (for example, 13.5 nm) and which uses a projection optical system constructed of a catoptric system. In a case of the application in the EUV exposure apparatus, a measurement reticle of the measurement device body is also of a reflection type.

Figure 12:
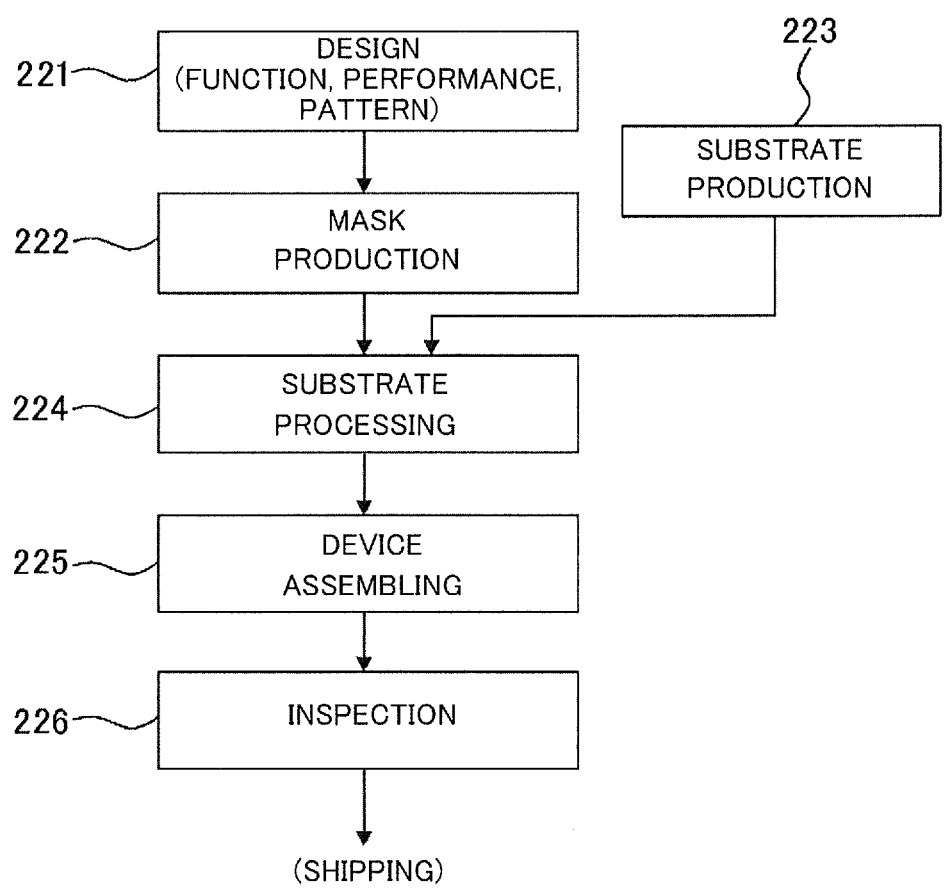
FIG. 12 is a flow chart indicating an example of steps for producing an electronic device.

In a case that an electronic device such as a semiconductor device (a microdevice) is produced by using the exposure apparatus EX or the exposure method of the embodiments described above, the electronic device is produced, as depicted in FIG. 12, by performing a step 221 of designing the function and the performance of the electronic device; a step 222 of manufacturing a mask (reticle) based on the designing step; a step 223 of producing a substrate (wafer) as a base material for the device; a substrate-processing step 224 including a step of exposing the substrate with a pattern of the mask by the exposure apparatus EX or the exposure method of the embodiments described above, a step of developing the exposed substrate, a step of heating (curing) and etching the developed substrate, etc.; a step 225 of assembling the device (including processing processes such as a dicing step, a bonding step, and a packaging step); an inspection step 226; and the like.

In other words, the method for producing the device includes a step of exposing the substrate (wafer W) via the pattern of the mask by using the exposure apparatus EX or the exposure method of the embodiments described above, and a step of processing the exposed substrate (namely, a developing step of developing a resist on the substrate and forming a mask layer corresponding to the pattern of the mask on the surface of the substrate, and a processing step of processing (heating, etching, etc.) the surface of the substrate via the mask layer).

According to the method for producing the device, the imaging characteristic of the projection optical system of the exposure apparatus EX can be maintained to a target state with high accuracy, thereby making it possible to produce electronic devices with high accuracy.

Note that the wavefront measuring method and device of the above-described embodiments are applicable also to a case of measuring the wavefront aberration of a projection optical system of a stepper-type exposure apparatus.

Further, the present teaching is applicable also to a case of measuring the wavefront aberration of an optical system that is different from the projection optical system of the exposure apparatus, for example, an objective lens of a microscope, or an objective lens of a camera, etc.

The present teaching is not limited to the embodiments described above, and may be embodied in other various forms or configurations within a scope without deviating from the gist or essential characteristics of the present teaching.

The disclosures of the published patent documents, the respective international publication pamphlets, the US patent documents, and the US patent application publication documents including the specifications thereof described in this application are incorporated herein by reference. Further, the disclosure of Japanese Patent Application No. 2012-123813 filed on May 30, 2012 including the specification, the claims, the drawings and the abstract is incorporated herein by reference in its entirety.

According to the embodiments described above, the transmittance distribution of the diffraction grating or the light amount distribution of the light beam coming into the optical system to be inspected has a sinusoidal distribution (sinusoidal-shaped distribution), and thus any effect of higher order diffracted lights, etc. allowed to exit (exiting) from the diffraction grating is lowered. Accordingly, the effect of the higher order interference lights, etc. is lowered and the wavefront information of the optical system to be measured can be measured with high accuracy.

The invention claimed is:

1. A wavefront measuring method for obtaining wavefront information of an optical system to be measured, the method comprising:

irradiating the optical system with a light beam via a light-exit section that causes the light beam to have a light amount distribution having periodicity in a first direction and a second direction crossing the first direction, allowing the light beam passed via the optical system to come into a diffraction grating which has periodicity in directions corresponding to the first direction and the second direction; and obtaining the wavefront information of the optical system by using an interference fringe formed by a plurality of light beams generated from the diffraction grating, wherein the light-exit section comprises:

first, second and third light-passing portions each allowing a light to pass therethrough, the first and second light-passing portions being arranged adjacently in the first direction, and the first and third light-passing portions being arranged adjacently in the second direction; and first and second light-shielding portions each shielding the light, the first light-shielding portion being arranged between the first and second light-passing portions such that each of the first and second light-passing portions is in contact with the first light-shielding portion, and the second light-shielding portion being arranged between the first and third light-passing portions such that each of the first and third light-passing portions is in contact with the second light-shielding portion, wherein widths, in the first direction, of the first and second light-passing portions are different from each other, and widths, in the second direction, of the first and third light-passing portions are different from each other, and the third light-passing portion has a width in the first direction equal to the width of the first light-passing portion in the first direction.

2. The method according to claim 1, wherein the light-exit section has a plurality of areas provided along the first direction, each of the areas including at least the first, second and third light-passing portions and the first and second light-shielding portions.

3. The method according to claim 1, wherein the light amount distribution in the first direction has a plurality of periods of the periodicity.

4. The method according to claim 1, wherein the light amount distribution in the first direction has a plurality of periods of a sinusoidal distribution.

5. The method according to claim 1, wherein the light amount distribution in the first direction is generated by the light-exit section; and the light-exit section is formed by arranging a plurality of light-passing portions which includes the first and second light-passing portions and each of which allows a light to pass therethrough, and a plurality of light-shielding portions which includes the first light-shielding portion and each of which shields the light alternately in the first direction such that N-pairs (N being an integer not less than 2) of one of the light-passing portions and one of the light-shielding portions are arranged in the first direction.

6. The method according to claim 5, wherein
the light-exit section has, in the first direction, a first light-exit section and a second light-exit section,
the first light-exit section being a section in which the plurality of light-passing portions and the plurality of light-shielding portions are alternately arranged in the first direction such that the N-pairs of the one of the light-passing portions and the one of the light-shielding portions are arranged in the first direction within a width corresponding to one period of the light amount distribution,
the second light-exit section being a section in which a plurality of light-passing portions which allows the light to pass therethrough and a plurality of light-shielding portions which shield the light are alternately arranged in the first direction such that N1-pairs (N1 being an integer not less than 2 and different from N) of one of the light-passing portions and one of the light-shielding portions are arranged in the first direction within the width corresponding to one period of the light amount distribution.

7. The method according to claim 5, wherein the light-exit section has a light source, and a measurement mask of which transmittance or reflectance in a direction corresponding to the first direction has a distribution,
and in a case of irradiating the optical system with a light beam allowed to exit from the light-exit section, the measurement mask is irradiated with a light beam allowed to exit from the light source and the optical system is irradiated with a light beam that has passed through the measurement mask.

8. The method according to claim 5, wherein
the light beam allowed to exit from the light-exit section has the light amount distribution, in the second direction, corresponding at least to one period of periodicity.

9. The method according to claim 8, wherein a light amount distribution of the light beam allowed to exit from the light-exit section is a product or sum of a first light amount distribution in the first direction and a second light amount distribution in the second direction.

10. The method according to claim 5, wherein the integer N is an odd or even number.

11. An exposure method for illuminating a pattern with an exposure light and exposing a substrate with the exposure light via the pattern and a projection optical system, the exposure method comprising using the wavefront measuring method as defined in claim 1 so as to measure wavefront aberration of the projection optical system.

12. A wavefront measuring device configured to obtain wavefront information of an optical system to be measured, the device comprising:
a light-exit section configured to allow a light beam to exit therefrom, the light beam having a light amount distribution, in a first direction and a second direction crossing the first direction, corresponding at least to one period of periodicity;
a diffraction grating into which the light beam allowed to exit from the light-exit section and having passed via the optical system comes, and which has periodicity in directions corresponding to the first direction and the second direction;
a detector configured to detect intensity distribution of an interference fringe formed by a plurality of light beams generated from the diffraction grating; and
an arithmetic unit configured to obtain the wavefront information of the optical system, by using a result of detection by the detector,
wherein the light-exit section comprises:
first, second and third light-passing portions each allowing a light to pass therethrough, the first and second light-passing portions being arranged adjacently in the first direction, and the first and third light-passing portions being arranged adjacently in the second direction; and
first and second light-shielding portions each shielding the light, the first light-shielding portion being arranged between the first and second light-passing portions such that each of the first and second light-passing portions is in contact with the first light-shielding portion, and the second light-shielding portion being arranged between the first and third light-passing portions such that each of the first and third light-passing portions is in contact with the second light-shielding portion, wherein
widths, in the first direction, of the first and second light-passing portions are different from each other, and
widths, in the second direction, of the first and third light-passing portions are different from each other, and
the third light-passing portion has a width in the first direction equal to the width of the first light-passing portion in the first direction.

13. The device according to claim 12, wherein the light-exit section has a plurality of areas provided along the first direction, each of the areas including at least the first, second and third light-passing portions and the first and second light-shielding portions.

14. The device according to claim 12, wherein the light amount distribution in the first direction has a plurality of periods of the periodicity.

15. The device according to claim 12, wherein the light amount distribution in the first direction has a plurality of periods of a sinusoidal distribution.

16. The device according to claim 12, wherein the light amount distribution in the first direction is generated by the light-exit section; and
the light-exit section is formed by arranging a plurality of light-passing portions which includes the first and second light passing portions and each of which allows a light to pass therethrough, and a plurality of light-shielding portions which includes the first light-shielding portion and each of which shields the light alternately in the first direction such that N-pairs (N being an integer not less than 2) of one of the light-passing portions and one of the light-shielding portions are arranged in the first direction.

17. The device according to claim 16, wherein
the light-exit section has, in the first direction, a first light-exit section and a second light-exit section,
the first light-exit section being a section in which the plurality of light-passing portions and the plurality of light-shielding portions are alternately arranged in the first direction such that the N-pairs of the one of the light-passing portions and the one of the light-shielding portions are arranged in the first direction within a width corresponding to one period of the light amount distribution, the second light-exit section being a section in which a plurality of light-passing portions which allows the light to pass therethrough and a plurality of light-shielding portions which shields the light are alternately arranged in the first direction such that N1-pairs (N1 being an integer not less than 2 and different from N) of one of the light-passing portions and one of the light-shielding portions are arranged in the first direction within the width corresponding to one period of the light amount distribution.

18. The device according to claim 16, wherein the light-exit section has a light source, and a measurement mask of which transmittance or reflectance in a direction corresponding to the first direction has a distribution, and in a case of irradiating the optical system with a light beam allowed to exit from the light-exit section, the measurement mask is irradiated with a light beam allowed to exit from the light source and the optical system is irradiated with a light beam that has passed through the measurement mask.

19. The device according to claim 16, wherein the second direction is orthogonal to the first direction.

20. The device according to claim 19, wherein a light amount distribution of the light beam allowed to exit from the light-exit section is a product or sum of a first light amount distribution in the first direction and a second light amount distribution in the second direction.

21. The device according to claim 16, wherein the integer N is an odd or even number.

22. An exposure method for illuminating a pattern with an exposure light and exposing a substrate with the exposure light via the pattern and a projection optical system, the exposure method comprising using the wavefront measuring device as defined in claim 12 so as to measure wavefront aberration of the projection optical system.

* * * * *